United States Patent
Schwaderer

(10) Patent No.: US 10,230,398 B2
(45) Date of Patent: Mar. 12, 2019

(54) ERASURE CODE DATA PROTECTION AND RECOVERY COMPUTATION SYSTEM AND METHOD

(71) Applicant: Samsung Electronics Co., Ltd., Suwon-si, Gyeonggi-do (KR)

(72) Inventor: William David Schwaderer, Saratoga, CA (US)

(73) Assignee: Samsung Electronics Co., Ltd., Suwon-si (KR)

(*) Notice: Subject to any disclaimer, the term of this patent is extended or adjusted under 35 U.S.C. 154(b) by 125 days.

(21) Appl. No.: 15/431,629

(22) Filed: Feb. 13, 2017

(65) Prior Publication Data
US 2018/0054217 A1 Feb. 22, 2018

Related U.S. Application Data

(60) Provisional application No. 62/377,096, filed on Aug. 19, 2016.

(51) Int. Cl.
*H03M 13/00* (2006.01)
*H03M 13/15* (2006.01)
(Continued)

(52) U.S. Cl.
CPC ....... *H03M 13/154* (2013.01); *G06F 11/1076* (2013.01); *H03M 13/15* (2013.01);
(Continued)

(58) Field of Classification Search
CPC .. H03M 13/154; H03M 13/15; H03M 13/158; G06F 11/1076
See application file for complete search history.

(56) References Cited

U.S. PATENT DOCUMENTS 7,003,712 B2 * 2/2006 Martinian ............. H03M 13/03
714/761
7,103,716 B1 9/2006 Nanda
(Continued)

FOREIGN PATENT DOCUMENTS

CN 104850468 A 8/2015
CN 104850504 A 8/2015
(Continued)

OTHER PUBLICATIONS

Li, et al., "GRID Codes: Strip-Based Erasure Codes with High Fault Tolerance for Storage Systems", Jan. 2009, http://dl.acm.org/citation.cfm?id=1480444, (22 pages).
(Continued)

*Primary Examiner* — Esaw T Abraham
(74) *Attorney, Agent, or Firm* — Lewis Roca Rothgerber Christie LLP

(57) ABSTRACT

A system and method for performing erasure code data protection and recovery computations using simple arithmetic and data manipulation functions. Other embodiments set forth techniques for using the computation functions with a multiplicity of compact one-dimension table lookup operations. A set of assigned multi-threaded processor threads perform computations on data values in parallel to generate erasure code data protection information and to perform data recovery operations using available data and the data protection information. During normal operations, in one embodiment, threads may perform parallel computations using a small set of simple arithmetic operations and data manipulation functions. In other embodiments, the threads may also use a multiplicity of compact one-dimension lookup tables stored within the multi-threaded processor or otherwise accessible by the multi-threaded processor to perform the computations.

19 Claims, 13 Drawing Sheets

(51) Int. Cl.
*G06F 11/10* (2006.01)
*H03M 13/37* (2006.01)

(52) U.S. Cl.
CPC ....... *H03M 13/158* (2013.01); *H03M 13/373* (2013.01); *H03M 13/3761* (2013.01); *H03M 13/6502* (2013.01)

(56) References Cited

U.S. PATENT DOCUMENTS

| | | | |
|---|---|---|---|
| 7,581,156 B2 * | 8/2009 | Manasse | H03M 13/1515 |
| | | | 714/781 |
| 8,145,941 B2 * | 3/2012 | Jacobson | G06F 11/1076 |
| | | | 714/6.24 |
| 8,150,031 B2 | 4/2012 | Gueron | |
| 8,296,515 B1 | 10/2012 | Saxena et al. | |
| 8,683,296 B2 | 3/2014 | Anderson et al. | |
| 9,116,833 B1 * | 8/2015 | Rakitzis | G06F 11/1076 |
| 9,405,623 B2 | 8/2016 | Taranta, II | |
| 9,501,353 B2 * | 11/2016 | Goker | H03M 13/154 |
| 9,647,690 B2 * | 5/2017 | Marov | H03M 13/154 |
| 9,985,654 B1 * | 5/2018 | Ruan | H03M 13/154 |
| 2014/0310571 A1 * | 10/2014 | Fetterly | G06F 11/1088 |
| | | | 714/764 |

FOREIGN PATENT DOCUMENTS

| | | |
|---|---|---|
| KR | 10-1241976 B1 | 3/2013 |
| KR | 10-1616347 B1 | 5/2016 |

OTHER PUBLICATIONS

Holland, et al., "Fast, On-Line Failure Recovery in Redundant Disk Arrays", Proceedings of the 23rd Annual International Symposium on Fault-Tolerant Computing, 1993, http://www.pdl.cmu.edu/PDL-FTP/Declustering/FTCS.pdf, (10 pages).

* cited by examiner

*FIG. 5*

0x2B ⊗ 0x6F = ?    0x2B = 0010.1011 α-Polynomial LABEL!!
                   0x6F = 0110.1111 α-Polynomial LABEL!!

```
    0x6F = |01101111|      ⟵ 705
  ⊗ 0x2B = |00101011|      ⟵ 705
705 ⟶     01101111          
705 ⟶    01101111           
         00000000           
705 ⟶  01101111             
705 ⟶ 00000000              
      01101111              
      00000000              
      00000000              
      ┌──────────────────┐
      │0001110010101001│
      └──────────────────┘
         ↑  ↑
        α¹¹ α¹⁰ α⁹
```

| Power | Member |
|-------|--------|
| 00 | 0x01 |
| 01 | 0x02 |
| 02 | 0x04 |
| 03 | 0x08 |
| 04 | 0x10 |
| 05 | 0x20 |
| 06 | 0x40 |
| 07 | 0x80 |
| 08 | 0x1D |
| 09 | 0x3A |
| 10 | 0x74 |
| 11 | 0xE8 |
| 12 | 0xCD |
| 13 | 0x87 |
| 14 | 0x13 |

Only need First 14 Entries From Powers Table (α⁷ ⊗ α⁷)

ERASURE CODE DATA PROTECTION AND RECOVERY COMPUTATION SYSTEM AND METHOD

CROSS-REFERENCE TO RELATED APPLICATION(S)

The present application claims priority to and the benefit of U.S. Provisional Application No. 62/377,096, filed Aug. 19, 2016, entitled "ERASURE CODE DATA PROTECTION AND RECOVERY COMPUTATION SYSTEM AND METHOD".

FIELD

One or more aspects of embodiments according to the present invention relate to computer data file protection systems and more specifically to an erasure code data protection and recovery computation system and method.

BACKGROUND

Data center storage systems require total storage capacity and overall performance beyond what one storage device can provide. As a consequence, these storage systems typically organize and manage a plurality of independent storage resources known as "storage device banks." The plurality of storage devices in a storage device bank can have different designs and characteristics that provide differing storage capacities and performance characteristics. They may comprise Hard Disk Drives (HDDs) with different access interfaces, Solid State Drives (SSDs) with different access interfaces, DRAM RAM-drives, persistent storage memory spaces that use non-volatile media, and so on. This approach enables data center computing systems to access multiple data file data blocks simultaneously by accessing multiple such storage devices within one or more storage device banks in parallel.

While storage device banks provide increased storage capacity and generally increased performance, the mean time to failure (MTTF) of a storage device bank degrades proportionately with increased numbers of independent storage devices. For example, if a single storage device has an MTTF of F and a storage bank consists of N such storage devices, then the MTTF of the storage bank is approximately F/N, a value that decreases as N becomes larger.

This degradation can result in an unsatisfactory Mean Time To Data Loss (MTTDL) probability for the storage device bank, potentially resulting in unnecessary data loss unless data loss prevention measures are undertaken. To protect data stored in storage bank storage devices from a degraded MTTF, fault recovery mechanisms are typically employed.

Erasure Coding refers to a well-known set of various techniques for utilizing data storage capacity within storage device banks to provide fault recovery. If a storage device such as an SSD can provide internal Erasure Coding support across its storage media, the storage device's MTTDL reliability and useable lifetime can significantly improve. When used across all or a subset of storage devices in a storage device bank, it can reduce a storage bank's overall MTTDL, thereby improving the storage device bank's reliability.

SUMMARY

Embodiments of the invention are generally directed to systems, solutions, and/or techniques that enable more efficient erasure code data protection and recovery computations that enables multiple computing systems to perform the recovery operations.

Embodiments of the present invention set forth methods for computers using erasure code data protection and recovery methods to perform data file erasure code computations in a high-performance manner. These methods allow erasure code data protection and recovery methods to generate erasure codes and to use them to recover lost or otherwise reconstruct file data.

In the methods, a Stripe comprises a set of S Data Units per data segment within the Stripe at a common offset within each segment, using a thread identification number to calculate a Stripe offset for accessing an assigned Stripe, computing a first Erasure Code by accumulating a plurality of values generated by performing, across each segment in the array of File Data Segments, a first exclusive-or operation based on the Data Unit offset within the assigned Stripe; for each Data Unit offset within the assigned Stripe, computing a multiplicity of additional individual Erasure Codes by accumulating a plurality of values generated by performing, across each segment in the array of File Data Segments, a second exclusive-or operation based on computed values determined using either a simple arithmetic functions or simple arithmetic functions combined with look-up table values obtained by lookup operations referencing compact one-dimension tables; and, for each Data Unit offset within the assigned Stripe, making the first Erasure Code and the multiplicity of additional individual Erasure Codes associated with the N File Data Segments available for storage disposition by the erasure code data protection and recovery function or other software systems.

Persons skilled in the art will appreciate that there is advantage in all Stripes used in an Erasure Code construction having the same size and that adjusting the size of a plurality of File Data Segments with fill Data Units may be necessary to ensure the last Stripe is filled with N×S values. Such fill Data Units can be stored with the File Data Units but should not be otherwise be regarded as actual File Data Unit values when accessing File Data Units. Of course, in other embodiments, the Stripe size may vary.

Some embodiments of the invention have the advantage that simplify otherwise complex erasure code data protection and recovery computations to simple, efficient arithmetic instructions. Other advantages of some embodiments are that complex erasure code data protection and recovery computations may be reduced to a combination of simple, efficient arithmetic instructions and table lookup operations using a multiplicity of one-dimension tables. These embodiments thereby reduce computational complexity and improve overall system efficiency. When the multiplicity of data file segments and related error recovery data segments are physically dispersed by storing them on different storage devices, multiple computing systems can recover lost data file segments and related error recovery data segments in parallel.

According to an embodiment of the present invention there is provided a system for storing data, the system including: a first processing circuit; the first processing circuit being configured to send to a second processing circuit: a plurality of input Data Units; a request specifying an erasure code operation to be performed, the erasure code operation being: a parity generation operation; or a systematic data recovery operation; and one or more constants to be used in performing the erasure code operation.

In one embodiment, the one or more constants include: a powers table, listing, for each of a plurality of input values, a power of the input value in a Galois field; and a logarithm table, listing, for each of the plurality of input values, a logarithm of the input value in the Galois field.

In one embodiment, each of the input Data Units is an n-bit number, n being a positive-integer power of 2, and the Galois field is GF(2^n).

In one embodiment, the one or more constants include an inverse array suitable for performing a systematic data recovery operation.

In one embodiment, the inverse array is a N×N array that when multiplied, in a Galois field, by a N×1 vector produces N recovered Data Units, N being a positive integer.

In one embodiment, the one or more constants include a multiplication table.

In one embodiment, the multiplication table lists, for each possible value of a first factor, a product of the first factor and a weight, the weight being one of a plurality of weights used to calculate a Q Erasure Code Data Unit as a weighted exclusive-or of Data Units in a slice.

According to an embodiment of the present invention there is provided a system for storing data, the system including: a first processing circuit; the first processing circuit being configured to send to a second processing circuit: a plurality of input Data Units; a request specifying an erasure code operation to be performed, the erasure code operation being: a parity generation operation; or a systematic data recovery operation; and a kernel, the kernel including machine code instructions that when executed by the second processing unit cause the second processing unit to perform the erasure code operation, wherein the kernel includes instructions for performing a multiplication of a first factor and a second factor, without conditional operations.

In one embodiment, the instructions for performing the multiplication of the first factor and the second factor include a plurality of left-shift operations and a plurality of addition operations, each addition operation of the plurality of addition operations being a modulo 2 addition operation and corresponding to a corresponding bit of the second factor having a value of 1.

According to an embodiment of the present invention there is provided a system for storing data, the system including: a first processing circuit; and a second processing circuit, the first processing circuit being configured to send to the second processing circuit: a plurality of input Data Units; a request specifying an erasure code operation to be performed, the erasure code operation being: a parity generation operation; or a systematic data recovery operation; and one or more constants to be used in performing the erasure code operation.

In one embodiment, the first processing circuit is a central processing unit and the second processing circuit is a graphics processing unit.

In one embodiment, the one or more constants include: a powers table, listing, for each of a plurality of input values, a power of the input value in a Galois field; and a logarithm table, listing, for each of the plurality of input values, a logarithm of the input value in the Galois field.

In one embodiment, each of the input Data Units is an n-bit number, n being a positive-integer power of 2, and the Galois field is GF(2^n).

In one embodiment, the one or more constants include an inverse array suitable for performing a systematic data recovery operation.

In one embodiment, the inverse array is a N×N array that when multiplied, in a Galois field, by a N×1 vector produces N recovered Data Units, N being a positive integer.

In one embodiment, the one or more constants include a multiplication table.

In one embodiment, the multiplication table lists, for each possible value of a first factor, a product of the first factor and a weight, the weight being one of a plurality of weights used to calculate a Q Erasure Code Data Unit as a weighted exclusive-or of Data Units in a slice.

In one embodiment, the second processing unit includes a plurality of cores, a first core of the plurality of cores being configured to: discover, at startup, an identification number of the first core and of a thread to be executed by the first core, and perform an erasure code operation using an input Data Unit stored at a memory address calculated using the identification number.

According to an embodiment of the present invention there is provided a method for storing or restoring data, the method including: sending, by a first processing circuit to a second processing circuit: a plurality of input Data Units; a request specifying an erasure code operation to be performed, the erasure code operation being: a parity generation operation; or a systematic data recovery operation; and one or more constants to be used in performing the erasure code operation; and performing, by the second processing circuit, the requested erasure code operation.

In one embodiment, the first processing circuit is a central processing unit and the second processing circuit is a graphics processing unit.

BRIEF DESCRIPTION OF THE DRAWINGS

These and other features and advantages of the present invention will be appreciated and understood with reference to the specification, claims, and appended drawings wherein:

FIG. 5 is a multiplication table, according to an embodiment of the present invention:

FIG. 7 is an arithmetic process diagram for performing a multiplication, according to an embodiment of the present invention.

DETAILED DESCRIPTION

Figure 1:
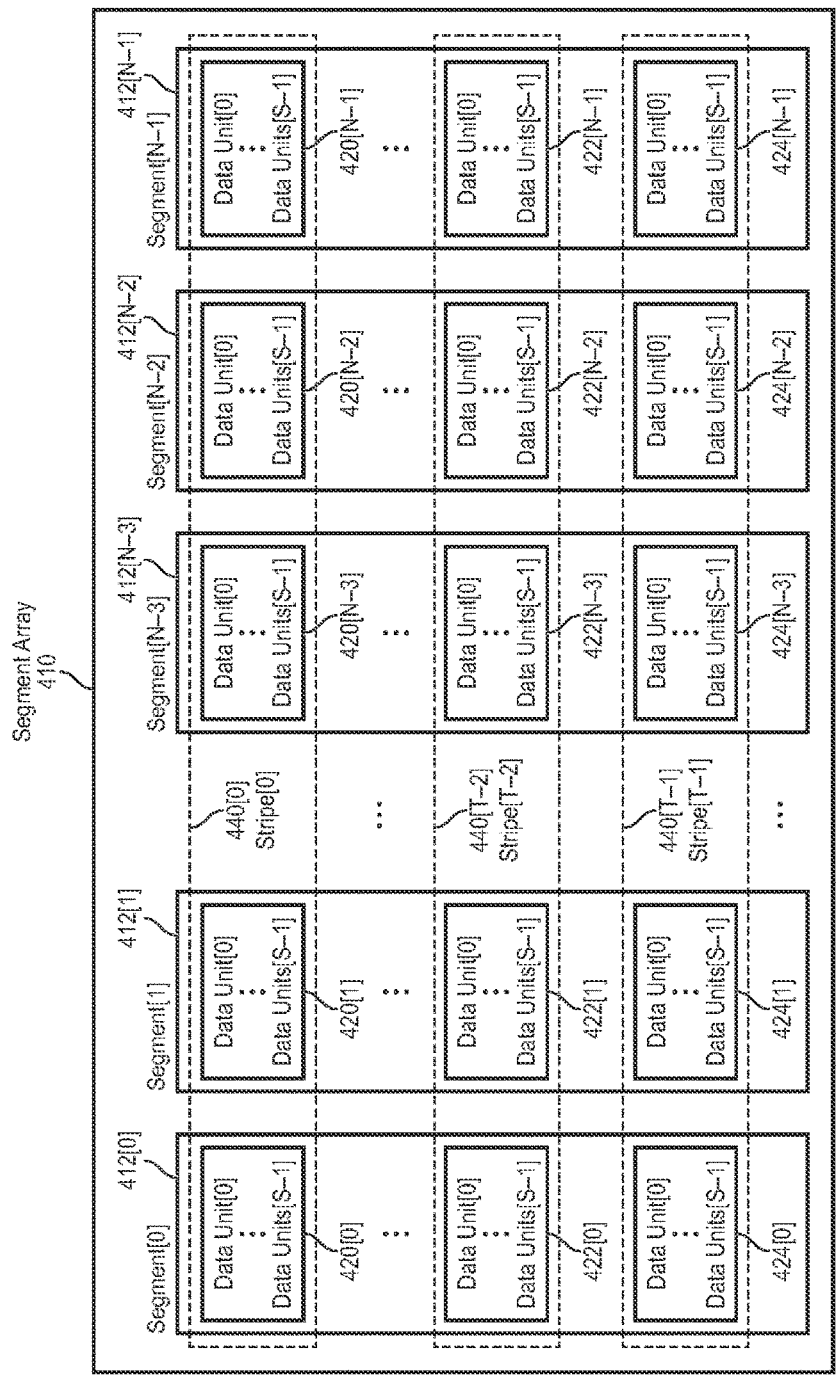
FIG. 1 is a set of independent storage File Data Segments configured as an erasure code data protection and recovery segment array, according to an embodiment of the present invention.

The detailed description set forth below in connection with the appended drawings is intended as a description of example embodiments of an erasure code data protection and recovery computation system and method provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

One popular data organization method that frequently uses Erasure Coding is known in the art is "Object Storage". With Object Storage, an individual data file is referred to as an "object".

It will be appreciated to those skilled in the art that any data block or portion thereof with a known size, including data files, data objects, and in-memory address ranges that may consist of an aggregation of data values from other data ranges, can be partitioned into N non-overlapping, equal size segments of contiguous data block data. The N segments are mutually exclusive, collectively exhaustive, and the multiplicity of segments may contain appended padding to simplify computation operations.

Assuming each segment contains K uniform-sized Data Units, where a Data Unit comprises a multiplicity of adjacent bits such as 4-bits, 8-bits, or 16-bits, and so on, it is to be noted that with such a data block partitioning process. N−1 segments are of equal size and the one remaining segment can initially have lesser size than the other N−1 segments. Appending a number of "fill" data characters, such as zero values, to the lesser size segment results in a segment with the size of the N−1 other segments, thereby producing N equal-size data segments, one of which has padding Data Units. Persons skilled in the art will recognize that there are other ways to partition known-size data blocks, data files, data objects, and in-memory data ranges and the suggested method is just one of many possible ways that is not to be considered as limiting the scope of this invention.

As is known in the art, with Erasure Coding, it is possible to construct a multiplicity M of related error recovery data segments ("Erasure Code" data) that provide fault protection for the previously constructed N File Data Segments. When properly constructed, the collective N+M segments and their storage on different devices, perhaps within a multiplicity of data banks or other separate physical locations such as data center racks, data center isles, data center rooms, data center floors and geographically distant data centers, allow the data banks storing the data segment and related error recovery data segments to experience storage device and data center component failures that are recoverable and, therefore, do not result in permanent data loss when proper operations commence to recover the lost data before too many other such failures occur.

In this generalized example, effective Erasure Coding protection allows any M of the N+M segments to be lost or otherwise inaccessible before File Data is irretrievably lost. To those skilled in the art, this is known as a "N of N+M" Erasure Code strategy because only N of the N+M segments need to be available to prevent data loss. One fundamental assumption is that an erasure code data protection and recovery System can identify which data segments are lost or otherwise unavailable and how they were originally constructed.

The operations to construct the multiplicity of M related error recovery data segments from the N data file segments operate on uniform-size Data Units within the N segments hereafter referred to as "Data Units". Data Unit size is constant for a given data block requiring protection but different data blocks can have different Data Unit sizes and different erasure code data protection and recovery Systems protecting a given data block using different methods can use different Data Unit sizes, though one method may not be able to use the related error recovery data segments a different method produces. In such instances, the methods are independent.

As indicated above, the Data Unit size can be 4-bits. 8-bits, or 16-bits, though other sizes are possible and the example sizes and are therefore not to be considered limiting of the scope of this invention. Hereafter, a data block requiring protection will be called "File Data".

When working with 4-bit Data Units in a "N of N+M" method, one property of conventional erasure code data protection and recovery is that the multiplicity of the M constructed related error recovery data segments can protect up to 16 original File Data Segments. That is, N must be less than or equal to 16. However, when working with 8-bit Data Units, the multiplicity of constructed related error recovery data segments can protect up to 256 original File Data Segments. Similarly, when working with 16-bit Data Units, the multiplicity of constructed related error recovery data segments can protect up to 65.536 original File Data Segments.

This increase in the number of File Data Segments that can be protected is important because the ability to work with an increased number of data file segments can be advantageous.

As one example, segmenting File Data into 20 equal-size data segments with 12 related error recovery data segments, a "20 of 32" approach, instead of 10 equal-size data segments with 6 related error recovery data segments, a "10 of 16" approach, allows an erasure code data protection and recovery scheme to generate twice as many related error recovery data segments without requiring additional storage capacity. Doubling the number of related error recovery data segments significantly strengthens the protection a method provides to File Data.

As a second example, some Erasure Code method strategies produce many more related error recovery data segments than original File Data Segments. The multiplicity of related error recovery data segments are usually scrambled versions of the original File Data. Therefore, it is often possible to discard the original, unscrambled data as a security measure because it is recoverable from the related error recovery data segments when needed.

As a third example, though it usually involves additional computational resources to update File Data related error recovery data segment information to ensure the ability to restore the various lost data segments, instead of a "10 of 16" or "20 of 32" method that both use 37.5 percent of the total storage capacity to store the 6 related error recovery data segments and data file segments, storage administrators can use a "20 of 26" method rather than a "20 of 32" method. This strategy provides the protection level of a "10 of 16" method but uses only 18.75 percent the total storage capacity to store the 6 related error recovery data segments rather than the previous 12. Moreover, it can decrease the computational resources used to ensure the ability to restore lost segments.

Persons skilled in the art will appreciate that 10 equal-size data segments with 6 related error recovery data segments and 20 equal-size data segments with 12 related error recovery data segments are simply examples and that other data segmentation and related error recovery data segment constructions are possible.

In addition, persons skilled in the art will also recognize it is advantageous to store different File Data Segments and error recovery data segments in different storage devices, perhaps even in different storage banks on different network switches on different data center floors and in different geographically distant data centers. This approach helps avoid single-point-of-failures by preventing the failure of a single storage device or data center resource such as a communication switch resulting in the loss of multiple segments associated with a particular, individual File Data.

While an individual storage device failure can result in the loss of many stored data segments associated with different File Data, the failure's impact can be significantly decreased if each lost segment belongs to a different data file. With such a segment storage dispersal strategy, multiple data center systems can initiate data restoration processes in parallel to recover the collectively lost segments, thereby accelerating recovery and decreasing the time interval a storage system operates in a compromised and operationally degraded mode while performing recovery operations.

In embodiments of the invention, the N File Data Segments in an erasure code data protection and recovery method are organized as a plurality of "Stripes" across the N File Data Segments. Each Stripe includes a uniform count of Data Units within each File Data segment and a corresponding count of Data Units within each related recovery data segment. The multiplicity of Data Units in a File Data segment within a given Stripe share a common offset value with the multiplicity of Data Units within the Stripe's other File Data Segments and recovery data segments.

To simplify discussion, let T designate the number of Stripes in an erasure code data protection and recovery method for a data file. The T Stripes will be designated Stripe[0]. Stripe[1], . . . , Stripe[T−2], and Stripe[T−1]. Since each data file segment or error recovery data segment has K Data Units, each Stripe has K/T Data Units from each File Data segment and related error data segment. For simplicity, let S be the number of Data Units from each File Data segment and related error data segment where S=K/T. Since S=K/T, T=K/S.

For a given Stripe, N segments store File Data and M segments store error recovery data, known as "Erasure Code Data Units," which may be used to protect associated File Data in the Stripe.

As indicated above, the number of Stripes. T, in an erasure code data protection and recovery method for a data file is equal to the number of Data Units, K, within a single File Data segment divided by the number of File Data segment Data Units, S, from an individual File Data segment in a Stripe. For example, if File Data Segments have 100.000 Data Units and the Stripes each contain 10 Data Units from each segment, there are 10.000 Stripes (100.000/10).

As previously discussed, a data file's contents may be partitioned into N non-overlapping, equal sized data segments that are mutually exclusive and collectively exhaustive. In addition, an erasure code data protection and recovery method generates a multiplicity M related error recovery data segments. For illustrative purposes and to simplify concept discussions, this description will assume the Data Unit size is an 8-bit byte and the value of M is 2. Persons skilled in the art will recognize that the Data Unit size can also have a different value such as 4-bits or 16-bits, or others, and M could equal 1, 2, or a number greater than 2 without departing the scope of the present invention.

An erasure code data protection and recovery method use data file segment Data Units to generate related error recovery data segments that have the same unit size as the File Data segment units. While Erasure Code methods can generate many types of Erasure Code Data Units, in this description, there are two types of Erasure Code Data Units, referred to as "P code Data Units" and "Q code Data Units." and they collectively comprise the two segments of fault recovery data. Since the size of constructed Data Units in error recovery data segments are the same size as the Data Units in the data file segments, each P code Data Unit and Q code Data Unit is 8-bits in size.

In any "N+M" erasure code data protection and recovery method, P code Data Units are computed as a binary exclusive-OR sum of N Data Units of File Data sharing an identical byte offset within each of N data file segments in a given Stripe, one byte per File Data segment. Hence, each data file segment contributes one byte to a P code Data Unit of a corresponding byte offset.

A corresponding Q code Data Unit is computed from the same set of N Data Units of File Data used to compute the P code Data Units. The Q code Data Unit is computed as an exclusive-OR sum of N products, where each product is computed by multiplying a corresponding byte of File Data by a constant-value coefficient associated with the segment number. For 8-bit Data Units, these multiplication operations are performed in a Galois Field $GF(2^8)$ as an extension field over $GF(2)$.

Persons skilled in the art will recognize that with one P code Data Unit, one Q code Data Unit, and the N Data Units of File Data used to compute the two P and Q codes, any two Data Units from the N+2 byte values may be lost (erased) and the 2 Data Units may be, nonetheless, recovered. As a result, when the File Data Segments and related error recovery data segments are all stored on different storage devices and any two of those storage devices within an erasure code data protection and recovery data bank arrangement fails, the erasure code data protection and recovery array can operate in a compromised mode, but without a loss of File Data.

Furthermore, replacement drives may be installed within the data banks accessible by the erasure code data protection and recovery method to populate the replacement drives with recovered segment data during a recovery operational mode. Persons skilled in the art will recognize more than two related error recovery data segments can be advantageously constructed without departing the scope of the present invention.

While an erasure code data protection and recovery protected disk bank can continue to operate in a compromised or recovery mode without losing File Data, the associated computational load needed to continue operating may become a significant burden for a single host processor.

In certain traditional data protection and recovery scenarios, forward progress of user applications accessing a compromised erasure code data protection and recovery storage device controlled by a single or small number of hosts can be almost completely stymied by the complex erasure code data protection and recovery computations needed to access to the compromised storage device array data.

Embodiments of the present invention are not limited to an array of disks. Instead, the below description is more general, and uses the reference "segment array" 114 to clarify that embodiments of the invention may work with any type of data storage, such as solid-state or other types of memory, as well as traditional disk arrays.

FIG. 1 illustrates a set of independent File Data Segments configured as an erasure code data protection and recovery segment array, according to one embodiment of the present invention.

Persons skilled in the art will recognize that the term "thread" may be used with a Complete Unified Device Architecture (CUDA) product and literature and that the Open Computing Language (OpenCL) developed by the Khronos Group has an analogous concept called a "work item". OpenCL is a framework for writing programs that execute across heterogeneous platforms consisting of host system central processing units (CPUs), graphics processing units (GPUs), digital signal processors (DSPs), field-programmable gate arrays (FPGAs) and other processors or hardware accelerators. Thus, using a graphics processing card as an embodiment example is one of many possible ways to embody the invention and is not to be considered as limiting the scope of this invention.

The parallel processors described herein may be programmed using CUDA programming, developed by Nvidia Corp. of Santa Clara, Calif. or by referring to such programming books as "Programming Massively Parallel Processors, A Hands-on Approach", Second Edition, David B. Kirk. Wen-mei W. Hwu, Morgan Kaufmann, 2013, the entire content of which is hereby incorporated herein by reference.

Erasure Code Data Protection and Recovery Computations

FIG. 1 illustrates a set of segments of File Data configured for use as an erasure code data protection and recovery segment array 410, according to one embodiment of the present invention. As described above, the segment array 410 may be an embodiment of what may be described as a Disk Array. Unlike the prior art, the segment array 410 is not limited to an array of disks, however, and may instead refer to any type of data storage device or devices including memory address ranges of DRAM and persistent memory resources. The example erasure code data protection and recovery segment array 410 of FIG. 1 comprises N segments 412(0) through 412(N-1), labeled Segment[0] through Segment[N-1]. Each segment 412 may include an arbitrary number of K total Data Units, wherein each Data Unit within the segment 412 is assigned a sequentially increasing offset value, typically starting with zero.

Data Units within the segments 412 are organized into sets that are referred to as Stripes. Each Stripe 440 comprises a set of S Data Units within each segment, typically characterized as having an equivalent offset value within each respective segment 412. For example, Data Units 420(0) through 420(N-1) comprise Stripe 440(0) at offset value 0, and Data Units 424(0) through 424(N-1) comprise Stripe 440(N-1) at File Data offset value S*(N-1).

Stripes 440(0) through 440(N-1) comprise a first group of Stripes. Additional groups of Stripes may be allocated after Stripe 440(N-1), for example beginning at a segment offset value of S*N. Groups of Stripes may be allocated in repeating patterns with respect to Stripes 440(0) through 440(N-1). Each segment comprises a set of K Data Units, labeled DataUnit[0] through DataUnit[k-1]. Each Data Unit within a segment is stored at a particular Data Unit offset. DataUnit[0] is stored at a byte offset of zero within a given segment, while DataUnit[k-1] is stored at a offset k-1 within the segment.

In certain embodiments, k is a power of two and each segment includes an integral power of two Data Units. Hereafter, a Data Unit will assumed to be an 8-bit byte and computations are performed in a Galois Field $GF(2^8)$ as an extension field over $(GF(2))$. Persons skilled in the art will recognize that other Data Unit sizes and Galois fields are possible and the assumption is just one of many possible and is not to be considered as limiting the scope of this invention.

Within each Stripe 440, N-2 segments 420(0) through 420(N-3) store File Data. Segment 420(N-2) stores P Erasure Code data and segment 420(N-1) stores Q Erasure Code data. As described later. P Erasure Code data and Q Erasure Code data are updated (write updates) when any segment File Data within the Stripe is updated.

The P Erasure Code segment data comprises K Data Units allocated to store P Erasure Code data for the associated File Data Segments in the Stripe. These Data Units are referred to as P Erasure Code Data Units.

The segment of Q Erasure Code data comprises K Data Units allocated to store the Q Erasure Code data for the associated File Data Segments in the Stripe. These Data Units are referred to as Q Erasure Code Data Units.

Within each Stripe, P and Q Erasure Code Data Units are calculated with respect to a given common byte offset over each segment in a given Stripe. For example, assuming the Data Unit size is an 8-bit byte, in Stripe 0, byte[0] from File Data segment 420(0) through File Data segment 420(N-3) is used to calculate one P Erasure Code byte stored in byte[0] of P segment 420(N-2) and one Q Erasure Code byte stored in byte[0] of Q segment 420(N-1).

Similarly, P and Q Erasure Code Data Units may be calculated for each byte offset from zero through K. Each time File Data is updated in any File Data segment within the Stripe, a new set of corresponding P and Q Erasure Code Data Units should be calculated and stored in their respective segments. Object storage systems may replace the entire object with a new object version, recalculating an entirely new P segment 420(N-2) and Q segment 420(N-1).

To generate one P Erasure Code byte, Data Units of File Data from a specific byte offset within each segment 412 are accumulated using an XOR summation operation. Equation 1 illustrates how to compute $P_j$, a P Erasure Code byte within in a segment having a segment offset j. In Equation 1, variable "i" indicates a File Data segment 420 index value for segment 420[i] which will be less than N-2. "j" indicates a segment offset which will be less than K, and "d" indicates a byte data value in segment 420[i] with segment 420 offset j.

$$P_j = \Sigma d_{i,j}$$

all File Data Segments $i$ $i<N-1$ \hfill (Equation 1)

From Equation 1, each P Erasure Code Data Unit within the P segment 412 (N-2) allocated to store P Erasure Code data should be computed by performing an XOR summation operation over corresponding File Data code Data Units.

To generate one Q Erasure Code byte, Data Units from a specific byte offset from each data file segment 412 are first multiplied by a constant $A_i$. These 8-bit Data Units multiplication operations are performed in a Galois Field GF(2^8) as an extension field over GF(2). The resulting product is added to an accumulated result using an XOR summation operation.

Persons skilled in the art will appreciate that the constants $A_i$ must be carefully selected to ensure that subsequent data recovery operation attempts are provided independent linear equations for data recovery calculations. In addition, there is advantage for one such $A_i$ to have a value of 1 since it eliminates a multiplication computation.

Equation 2 illustrates how $Q_j$, a Q Erasure Code byte within in the Q segment 412 (N−1) having a segment offset j, should be computed. As in Equation 1, in Equation 2, variable "i" indicates a File Data segment 412 (i) number, "j" indicates a segment offset within the File Data segment 412, and "d" indicates a byte data value with segment offset j in File Data segment i.

$$Q_j = \Sigma A_i \otimes d_{i,j}$$

all File Data Segments i $$i < N-2 \qquad \text{(Equation 2)}$$

For 8-bit Data Units, the multiplication operator in Equation 2 takes place in a Galois Field GF(2^8) as an extension field over GF(2). This extension can be formed using any primitive polynomial from a set of sixteen well known primitive polynomials, although the well-known polynomial 0x011D is conventionally used in erasure code data protection and recovery methods.

During normal erasure code data protection and recovery operations, a first segment 410, hereafter designated segment x, may fail to be available and need recovery. Furthermore, a second segment 410, hereafter designated segment y, may also fail to be available and need recovery.

One practical assumption is that if a given segment fails to be available, the failure is known to a host system. Hence, a host system knows the values of x and y.

For a given x and y storage device failures, any combination of File Data. Q Erasure Code data, or P Erasure Code data may be present on a failed drive depending on which segment 410 is being accessed. Each loss scenario uses a specific recovery strategy.

In a scenario involving a single storage device failure, segment data from one segment within a given Stripe is "erased." The erased segment may store P Erasure Code data, Q Erasure Code data, or File Data.

In a single storage device failure scenario involving erased P Erasure Code data or Q Erasure Code data, the corresponding data may be recomputed from the accessible File Data. In a single storage device failure scenario involving erased File Data, an XOR summation operation taken over values within remaining, available File Data Segments and the P Erasure Code data may be used to reconstruct the erased File Data associated with one failed drive.

In a two-drive failure scenario involving both a P Erasure Code data segment and Q Erasure Code data segment, the erased P Erasure Code data segment data and the Q Erasure Code segment data may be recomputed from the accessible File Data. In a two-drive failure scenario involving one File Data segment and a Q Erasure Code data segment, the remaining, accessible File Data Segments and the P Erasure Code data segment may be first used to re-compute the erased File Data, allowing the re-computation of the failed Q Erasure Code data.

In a scenario involving two simultaneous drive failures (on storage devices x and y) that result in erasure of two File Data Segments, the remaining, accessible File Data Segments, the P Erasure Code data, and Q Erasure Code data may be used to reconstruct the two erased File Data Segments.

Equations 3 through 12 detail steps that may be used to reconstruct two values of erased File Data (one erased value per erased segment) using the one corresponding P Erasure Code value and the one corresponding Q Erasure Code value. Each File Data value within both erased File Data Segments may be reconstructed using these steps.

In Equation 3, a sum. $P_{xy}$, of remaining, accessible File Data data values is computed over a set of viable data values of File Data ($d_i$) from non-failed storage devices using a summation operation equivalent to the summation operation used to generate the P Erasure Code value, except storage devices x and y are excluded because data from those storage devices is not available.

$$P_{xy} = \Sigma d_i$$

Over File Data Segments $$i \neq x, i \neq y \qquad \text{(Equation 3)}$$

As indicated in Equation 4, below, the sum of $P_{xy}$ and the accessible P Erasure Code value (P) is equivalent to the sum of the two erased data values, $d_x$ and $d_y$.

$$P \oplus P_{xy} = d_x \oplus d_y \qquad \text{(Equation 4)}$$

In Equation 5, a sum of viable data values, $Q_{xy}$, is computed over a set of viable data values of File Data ($d_i$) from available File Data Segments stored on non-failed storage devices. The computation is a summation operation equivalent to the summation operation of Equation 2 used to generate the Q Erasure Code value, except the File Data Segments stored on failed or otherwise unavailable storage devices x and y are excluded.

$$Q_{xy} = \Sigma A_i \otimes d_{i,j}$$

$$i \neq x, i \neq y \qquad \text{(Equation 5)}$$

As indicated in Equation 6 below, the sum of $Q_{xy}$ and the Q Erasure Code value is equivalent to the sum of the products of each erased data value multiplied by a respective $A_i$.

$$Q \otimes Q_{xy} = (A_x \otimes d_x) \otimes (A_y \otimes d_y) \qquad \text{(Equation 6)}$$

Let $p_{xy} = P \otimes P_{xy}$ and $q_{xy} = Q \otimes Q_{xy}$. With this notation, Equations 4 and 6 are rewritten as Equations 7 and 8, below.

$$p_{xy} = d_x \otimes d_y \qquad \text{(Equation 7)}$$

$$q_{xy} = (A_x \otimes d_x) \otimes (A_y \otimes d_y) \qquad \text{(Equation 8)}$$

Multiplying both sides of Equation 7 by AK yields Equation 9, below.

$$(A_x \otimes p_{xy}) = (A_x \otimes d_x) \otimes (A_x \otimes d_y) \qquad \text{(Equation 9)}$$

Adding Equation 9 to Equation 7 using the exclusive-or operator yields Equation 10, below.

$$(A_x \otimes p_{xy}) \otimes q_{xy} = (A_x \otimes d_y) \otimes (A_y \otimes d_y) \qquad \text{(Equation 10)}$$

Persons skilled in the art will recognize that $d_y$ may be isolated from Equation 10, to yield Equation 11, below.

$$d_y = (A_x \otimes p_{xy} \otimes q_{xy}) \otimes (A_x \otimes A_y)^{-1} \qquad \text{(Equation 11)}$$

Since $A_x$, $A_y$, $p_{xy}$, and $q_{xy}$ all have known values, the expression $$(A_x \otimes p_{xy} \otimes q_{xy}) \otimes (A_x \otimes A_y)^{-1}$$

can be evaluated to obtain the value of $d_y$. Persons skilled in the art will recognize that the value of $(A_x \otimes A_y)$ must not be zero because zero has no multiplicative inverse. The value of $(A_x \otimes A_y)$ will not be zero if the set of A coefficients were correctly selected before generating the related error recovery data segments using independent linear equation evaluations.

Adding $d_y$, isolated in Equation 11, to both sides of Equation 7 isolates $d_x$, as Equation 12 shows below.

$$d_x = p_{xy} \otimes d_y \quad \text{(Equation 12)}$$

Since $p_{xy}$ and $d_y$ now have known values, the expression $$p_{xy} \otimes d_y$$

can be evaluated to obtain the value of $d_x$.

At this point, both values of erased File Data (on failed storage devices x and y) have been recovered and the process repeats to recover the other missing File Data values.

Importantly, all mathematical calculations may be performed with computed values $p_{xy}$, $q_{xy}$, and pre-computed tables as follows.

Letting the constant $V_{xy} = (A_x \otimes A_y)^{-1}$ and substituting into Equation 11 gives Equation 13 below.

$$d_y = [(A_x \otimes V_{xy}) \otimes (p_{xy})] \otimes (q_{xy} \otimes V_{xy}) \quad \text{(Equation 13)}$$

Letting the constant $W_{xy} = (A_x \otimes V_{xy})$ and substituting into Equation 13 gives Equation 14 below.

$$d_y = (W_{xy} \otimes p_{xy}) \otimes (q_{xy} \otimes V_{xy}) \quad \text{(Equation 14)}$$

In Equation 14, both $V_{xy}$ and $W_{xy}$ are constant values that are repetitively used in multiplication operations to recover a collective of File Data segment Data Units. It is important that these multiplication operations are computationally intensive.

Because both $V_{xy}$ and $W_{xy}$ are constant values, they can be calculated once by a host connecting a graphical processing unit and delivered to the graphical processing unit before data recovery operations begin. This pre-calculation relieves the thread programming from performing the calculations to determine $V_{xy}$ and $W_{xy}$, thereby accelerating operations. This simplifies the $d_y$ recovery operation by reducing it to exclusive-oring the products of two multiplication operations performed in a Galois Field as an extension field over GF(2).

To further accelerate data recovery operations, before data recovery operations begin, a host connecting a graphical processing unit can deliver two complete one-dimension multiplication tables designated V[ ] and W[ ] to the graphical processing unit. V[ ] would contain the Galois Field GF(2^8) products values of all possible Data Unit values times $V_{xy}$. W[ ] would contain the Galois Field GF(2^8) products values of all possible Data Unit values times $W_{xy}$.

For example, if Data Units are 4-bits in size, V[3] would contain the Galois Field GF(2^4) as an extension field over GF(2) multiplication product value of $(3 \otimes V_{xy})$. Similarly, W[7] would contain the Galois Field GF(2^4) as an extension field over GF(2) multiplication product value of $(7 \otimes W_{xy})$.

With 4-bit Data Units, each one-dimension table would have 16 entries. Entry values V[0] and W[0] would always be zero. Also, the entry value for element V[1] would always be $V_{xy}$ and the entry value for element W[1] would always be $W_{xy}$. To conserve memory space, the V[0] and W[0] table entries can be eliminated since their values are always zero by definition. Similarly, table entries for V[1] and W[1] can be eliminated since the values are always $V_{xy}$ and $W_{xy}$. Thus an embodiment may omit these table entries to conserve memory space, though the threads performing recovery must be aware of their absence and adjust their table lookup operation index values accordingly. In addition, with 4-bit Data Units, each element uses one half an 8-bit byte. Thus packing the 4-bit values into bytes reduces a table's size by half, further conserving space.

However, any space economy benefits gained by omitting the V[0] and W[0] table entries or by packing the 4-bit values may be at the expense of thread efficiency. For example, by omitting the V[0] and W[0] table entries, thread processing must continually test if the $A_i$ coefficients have a 0 or 1 value to compensate for the reduced-space table construction.

Depending on the graphics processing unit architecture, omitting the V[0] and W[0] table entries might result in thread path divergence performance penalties since many parallel executing threads may not have data values that are 0 or 1. Therefore they may suspend operations to wait for the threads that do have 0 or 1 data values to perform their operations in order to maintain SIMT synchronization.

However, having the V[ ] and W[ ] tables greatly simplifies the calculations necessary to recover $d_y$ in Equation 14 because the recovery operation is now reduced to one one-dimension table lookup operation in each of two small tables that extract a value from V[ ] and W[ ] and then exclusive-oring the two extracted values to recover $d_y$.

Prior to normal operation of the erasure code data protection and recovery operations for segment array 410, each of the two one-dimension, pre-computed tables should be computed and stored in memory accessible to a processor responsible for erasure code data protection and recovery computations. The method to compute a multiplication product of two 4-bit Data Unit multiplicands in the Galois Field GF(2^4) as an extension field over GF(2) multiplication product value is as follows.

Assume that the two 4-bit values to be multiplied are 0x0D and 0x0B. Expressing these two values as bit patterns, these values are $1101_b$ and $1011_b$ respectively. Multiplying and exclusive-oring the intermediate results gives a value of $1111111_b$:

1101

$\otimes$ 1011

1101

1101 . . .

0000 . . .

1101...

1111111

This type of multiplication operation is known as a bit-wise modulo 2 multiplication and generally produces values that have more than four significant bits. Persons skilled in the art will recognize that values that have more than four significant bits are first converted to the 4-bit values they are congruent to in the Galois Field GF(2^4).

Those skilled in the art also appreciate there are two primitive polynomials associated with Galois Field (GF (2^4). They are $x^4+x+1$ and $x^4+x^3+1$, respectively represented by the numbers 0x13 and 0x19.

Selecting the 0x13 value as the primitive polynomial representation, we compute the value of $1111111_b$ modulus 0x13 using bit-wise modulo two division to obtain the product of 0x0D) and 0x0B.

Noting that 0x13 has a binary representation of $10011_b$, and using exclusive-or to combine intermediate division results to perform a bit-wise modulo 2 division produces:

```
         1111
10011√1111111
    10011
    11001
    10011
    10101
    10011
     0110
```

Hence, the product of the 4-bit Data Units 0x0D and 0x0B using the primitive polynomial representation value 0x13 is $0110_b$, or 0x06, which is a 4-bit value and a member of the Galois Field GF(2^4). If we had used the other primitive polynomial representation value of 0x19, we would have produced a different value.

Persons skilled in the art will recognize that an Erasure Code Protection and Recovery method must consistently use the same primitive polynomial representation value to calculate related error recovery data segments and to recover failed data values.

Using this aforementioned method allows host processors to build the two one-dimension lookup tables mentioned earlier. Similar product calculation methods also work for other Data Unit sizes and are possible because the data recovery mathematical process is actually a matrix inversion process. Carefully selecting the $A_i$ coefficients guarantees the matrix always inverts.

Persons skilled in the art will recognize that 8-bit Data Units will use the binary representation of a primitive polynomial of the eighth-order as the modulus operator value. Therefore, the suggested 4-bit Data Unit example is not to be considered as limiting the scope of this invention and that such methods for Data Units with other sizes are within the scope of the invention.

Finally, with an Erasure Code Protection and Recovery method that protects an "X of X+Y" configuration, any Y data segments can become unavailable. The aforementioned methods also are effective in recovering data when Y or fewer than Y segments 412 are lost. The recovery process simply solves a set of linear equations that have the lost values as variables, using the exclusive-or operator for the additive operator and performing multiplication operations in a Galois Field GF(2^8) as an extension field over GF(2). In these operations, persons skilled in the art will recognize that the graphics processing unit may be performed these techniques in parallel.

In another embodiment, a host system with a graphics processing unit can precompute two one-dimension tables for a data value that allows the graphics processing unit to calculate multiplication products using that value and perform division operations using that value by calculating value inverses and using them as multiplicands in operations.

In this embodiment, one table is a Powers Table and the other table is a Logarithm Table. For sake of exposition simplicity, assume the Data Unit size is 3-bits.

Practitioners skilled in the art recognize a 3-bit Galois Field GF(2^3) has two primitive polynomials, namely $x^3+x+1$ and $x^3+x^2+1$. The respective primitive polynomial representation values are 0x0B and 0x0D. As an example, we select $x^3+x+1$ as our primitive polynomial.

Letting $\alpha$ be a root of $x^3+x+1$, we have $\alpha^3+\alpha+1=0$. Therefore, we have Equation 15 below.

$$\alpha^3=\alpha+1 \qquad \text{(Equation 15)}$$

Cycling the powers of $\alpha$ and, from Equation 15, substituting $\alpha+1$ for $\alpha^3$ whenever it appears gives:

$\alpha^0=1$ $\alpha^1=\alpha$ $\alpha^2=\alpha^2$ $\alpha^3=\alpha^3=\alpha+1$ (from Equation 15)

$\alpha^4=\alpha^2+\alpha$ $\alpha^5=\alpha^3+\alpha^2=(\alpha+1)+\alpha^2=\alpha^2+\alpha+1$ (substituting from Equation 15)

$\alpha^6=\alpha^3+\alpha^2+\alpha=(\alpha+1)+\alpha^2+\alpha=\alpha^2+1$ (substituting from Equation 15)

$\alpha^7=\alpha^3+\alpha=(\alpha+1)+\alpha=1$ (substituting from Equation 15)

Similarly.

$\alpha^8=(\alpha^7)(\alpha)=(1)(\alpha)=\alpha$ $\alpha^9=(\alpha^7)(\alpha^2)=(1)(\alpha^2)=\alpha^2$ $\alpha^{10}=(\alpha^7)(\alpha^3)=(1)(\alpha^3)=\alpha+1$ $\alpha^{11}=(\alpha^7)(\alpha^4)=(1)(\alpha^4)=\alpha^2+\alpha$ We can now construct a first Powers Table below:

| $\alpha$ Power Value | Polynomial Result | Polynomial Result Numeric Representation |
|---|---|---|
| 0 | 1 | 0x01 |
| 1 | $\alpha$ | 0x02 |
| 2 | $\alpha^2$ | 0x04 |
| 3 | $\alpha + 1$ | 0x03 |
| 4 | $\alpha^2 + \alpha$ | 0x06 |
| 5 | $\alpha^2 + \alpha + 1$ | 0x07 |
| 6 | $\alpha^2 + 1$ | 0x05 |

Using the first Powers Table as a lookup table, we can quickly determine that $\alpha^5$=0x07. That is, entry 5 of the Polynomial Result Numeric Representation column has a value of 0x07. From this table, it is possible to build a one-dimension powers array that uses the a power value as an index value.

The index range in the first Powers Table value is from 0 to 6 inclusive. Noting that the exponentiation values of $\alpha$ repeat after raising a to the sixth power allows us to use a modulus 7 operation for values outside the 0 to 6 range.

The first Powers Table is sorted on the a Power column. Sorting on the Polynomial Result Numeric Representation column and rearranging columns gives us the base $\alpha$ Logarithm Table below:

| Polynomial Result Numeric Representation | $\alpha$ Power Required to get the Polynomial Result Numeric Representation |
|---|---|
| 0x01 | 0x00 |
| 0x02 | 0x01 |
| 0x03 | 0x03 |
| 0x04 | 0x02 |
| 0x05 | 0x06 |
| 0x06 | 0x04 |
| 0x07 | 0x05 |

This Logarithm Table allows us to quickly determine that $\log_\alpha(0x05)$=0x06. Checking the first Powers Table, we find this is true because $\alpha^6$=0x05.

Persons skilled in the art will recognize that expressing the Galois Field elements as powers of a allows graphics processing unit threads to compute multiplication products by first adding the exponential values of a that represent the multiplicands using normal base 10 arithmetic. Then, for this Galois Field GF(2^3) example, applying a base 10 modulus 7 operation on the sum produces a numeric value that ranges in value from 0 to 6. Using this value as a Powers Table index then determines the multiplication product of the two multiplicands.

Persons skilled in the art will also recognize that, for this Galois Field GF(2^3) example, the inverse value of an element is determined by expressing the Galois Field elements as a power of a, subtracting that value from 7 using base 10 mathematics, and by using the calculated difference as an index value in the Powers Table.

Using this aforementioned method allows host processors to build the two one-dimension Powers and Logarithm lookup tables and pass them to graphical processing units for multiplication and division calculations. Similar Powers and Logarithm Table generation methods work for other Data Unit sizes. For example, 8-bit Data Units will have one-dimension Powers and Logarithm Tables with 255 entries. Therefore, persons skilled in the art will appreciate that the Galois Field GF(2^3), 3-bit Data Unit, example suggested for simplicity and discussion clarity is not to be considered as limiting the scope of this invention and that such methods for Data Units with other sizes are within the scope of the invention.

In another embodiment of the invention, a thread can evaluate the result of a bitwise modulo 2 multiplication value. In the above Galois Field GF(2^4) 4-bit example, the computed product value using the primitive polynomial representation value of 0x13 was $1111111_b$. The value 0x13 is the numeric representation of the selected primitive polynomial $x^4+x+1$.

Letting $\alpha$ be a root of this polynomial, we have $\alpha^4+\alpha+1=0$. Therefore, we have Equation 16 below.

$$\alpha^4=\alpha+1 \quad \text{(Equation 16)}$$

Cycling the powers of a and, from Equation 16, substituting $\alpha+1$ for $\alpha^4$ whenever it appears gives:

$\alpha^0=1$ $\alpha^1=\alpha$ $\alpha^2=\alpha^2$ $\alpha^3=\alpha^3$ $\alpha^4=\alpha+1$ (from Equation 15)

$\alpha^5=\alpha^2+\alpha$ $\alpha^6=\alpha^3+\alpha^2$

So, $$\alpha^4+\alpha+1=0 \quad \text{(Equation 17)}$$

$$\alpha^5+\alpha^2+\alpha=0 \quad \text{(Equation 18)}$$

$$\alpha^6+\alpha^3+\alpha^2=0 \quad \text{(Equation 19)}$$

Reducing the three polynomials in Equations 17, 18, and 19 to a binary numeric representation provides the respective values $0010011_b$ for $\alpha^4+\alpha+1$, $0100110_b$ for $\alpha^5+\alpha^2+\alpha$, and $1001100_b$ for $\alpha^6+\alpha^3+\alpha^2$. Since Equations 17, 18, and 19 show the value of each of the three expressions all equal to zero because they, we can combine them with the bit-wise modulo 2 product value $1111111_b$ as follows:

$1111111_b$
$1001100_b$
$0100110_b$
$(+)0010011_b$
$0000110_b$

Hence, using this approach converts the value $1111111_b$ to the 4-bit value $0110_b$ by removing high-order significant bits that prevent $1111111_b$ from being a 4-bit value. This converts $1111111_b$ to its congruent value in the Galois Field GF(2^3) and the operation generates the value previously generated using the bit-wise modulo 2 division process.

The significant-bit removal conversion process for this Galois Field GF(2^3) example uses three values a host system can compute in advance and transfer to a graphics unit. Alternately, a thread program can have them compiled as constant values or definitions. In either case, the thread is relieved of having to calculate the values in Equations 17, 18, and 19, thereby accelerating thread processing and increasing thread performance.

Persons skilled in the art will understand that any system configured to perform the method steps, in any order, is within the scope of the invention. The values could be combined together and then combined with the bit-wise modulo 2 multiplication product. Alternately, they could be individually added to the bit-wise modulo 2 multiplication product to progressively remove the contribution of the unwanted high-order bit positions.

In another embodiment of the invention, the Data Unit size may result in Powers and Logarithm Tables that are too large for graphics processor units to use. For example, 16-bit Data Units would require multiplication tables or Powers and Logarithm Tables that are each 131,072 bytes (128 KB) in size. In such instances, to compute Galois Field multiplication operations as an extension field over GF(2), graphics processing unit threads can directly perform the previously discussed bit-wise modulo 2 multiplication followed by the primitive polynomial numeric operation modulus operation.

To perform division by a value X by multiplying with the inverse value of X requires graphics processing unit threads to compute inverse values. To calculate an inverse value graphics processing units can perform the well-known Extended Euclidian Algorithm using the primitive polynomial numeric representation as the larger numeric value, the X value as the smaller numeric value, bit-wise modulo 2 multiplication and division for multiplication and division operations, and exclusive-or operations for addition. Alternately, hosts can precompute constants and transfer them to a graphics processing unit as before.

In another embodiment, bit-wise modulo 2 multiplication operations can be accelerated by predetermining multiplicand shift patterns for the $A_i$ coefficients used in Q segment Data Unit computations. For example, suppose $A_7=0x02$. Bit-wise modulo 2 calculating $(0x04(+)A_7)$ simply becomes an operation that bit-shifts 0x04 one position to the left and stripping off any unwanted higher-order bit that may be present using the previously discussed method. In the C programming language, the shifting operation is programmed as:

(0x04)<<1

Similarly, if $A_7=0x0A$, the C programming language bit-wise modulo 2 multiplication operation is programmed as:

((0x04)<<3)(+)((0x04)<<1)

A generalized multiplication approach that does not use predetermined shift patterns requires threads to determine what shifts are required. Predetermining the shift patterns avoids unnecessary overhead in bit-wise modulo 2 multiplication operations used in Q segment Data Unit computations.

In the above example, persons skilled in the art will recognize that it may be advantageous to first calculate ((0x04)<<1) and assign the result to a temporary register variable named, for example, "Temp". The C programming language bit-wise modulo 2 multiplication operation can then become:

(Temp<<2)⊕Temp

Depending on the speed of the shifting and temporary register variable assignment operations, this approach may provide higher performance than the method that did not use a temporary register variable assignment.

Figure 2A:
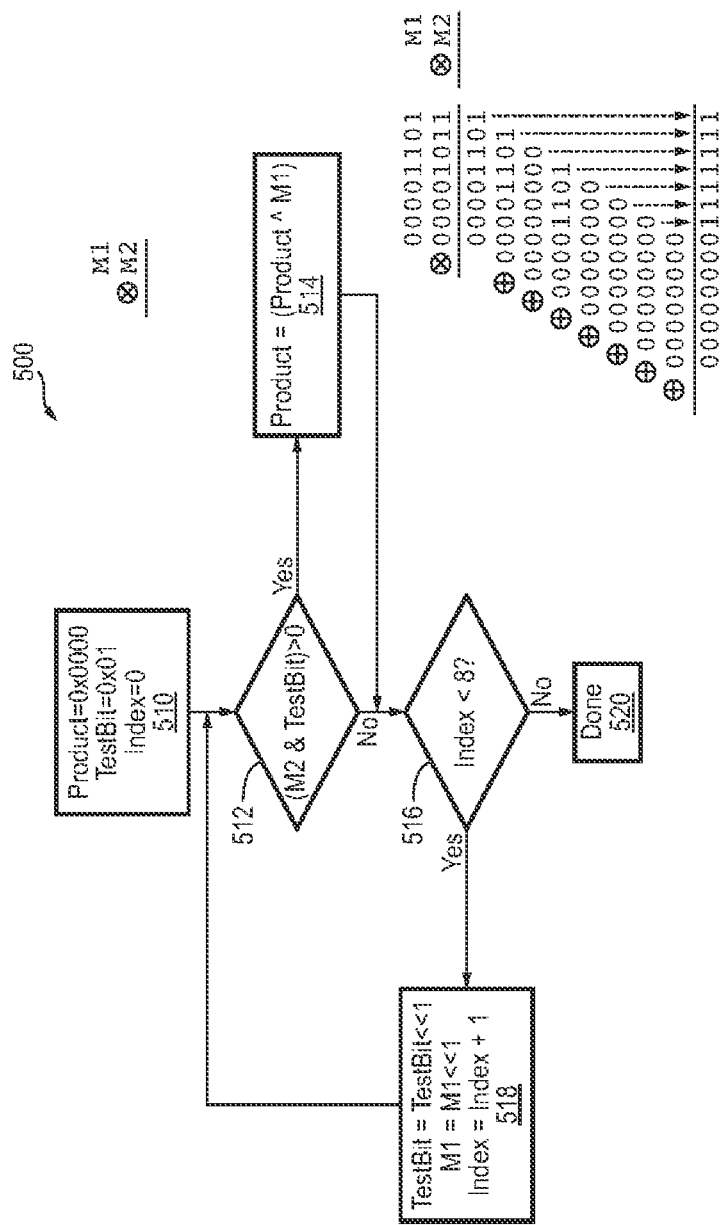
FIG. 2A is a flow chart of a method for computing a bit-wise modulo 2 multiplication product, according to an embodiment of the present invention.

FIG. 2A is an example flow diagram of method steps for dynamically computing a bit-wise modulo 2 multiplication product for 8-bit values without using predetermined shift operations according to one embodiment of the invention. In FIG. 2A, a first 8-bit multiplicand "M1" with bit positions 0 through 7 is multiplied by a second 8-bit multiplicand "M2" with bit positions 0 through 7.

The method begins in step 510 where the variable "Product" is initialized to a zero value, the test bit mask "TestBIt" that tests M2 bit values is set to test the low order bit, bit 0, and the loop index "Index" is set to a zero value.

Step 512 determines whether a tested M2 bit has a binary 1 bit value. If the tested M2 bit has a bit value of binary 0, control passes directly to step 516. If the tested M2 bit has a bit value of binary 1, control passes to step 514 which exclusive-ors the current value of Product with the current value of M1, assigns the result to Product, and proceeds to step 516.

Step 516 tests whether all 8 M2 bit position tests have completed. If not, one or more additional loop iterations are used and control passes to step 518. Step 518 shifts the test bit position to test the next higher-order M2 bit, left shifts the value of M2 one bit position, and increments the loop index. Control then passes back to step 512 for another loop iteration.

Eventually step 516 determines that 8 loop iterations have completed and control passes to step 520 and the process ends having successfully calculated a 15-bit bit-wise modulo 2 product value that is then converted to a congruent finite field element in a Galois Field GF(2^8) as an extension field over GF(2).

Figure 2B:
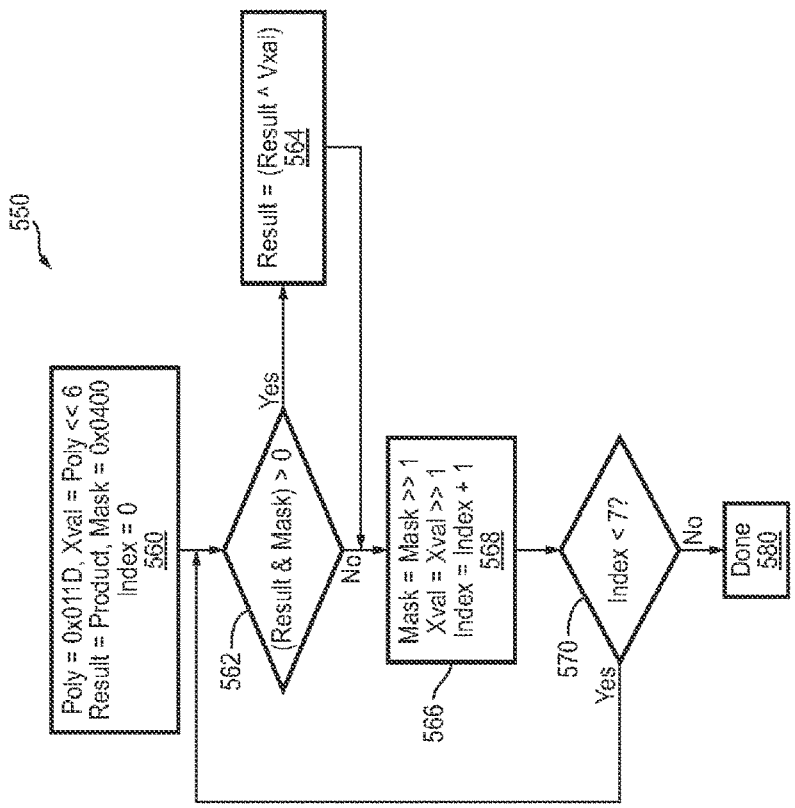
FIG. 2B is a flow diagram of method steps for converting a bit-wise modulo 2 multiplication product to its congruent element within a Galois Field GF(2^8) as an extension field over GF(2) for the 0x011D primitive polynomial, according to an embodiment of the present invention.

FIG. 2B is an example flow diagram of method steps for converting a 15-bit bit-wise modulo 2 multiplication product to its congruent element within a Galois Field GF(2^8) as an extension field over GF(2) for the 0x011D primitive polynomial.

For description clarity, the method begins in step 560 by setting a "Poly" variable to the polynomial's numeric representation value. It next left-shifts the otherwise unused Poly value 6 bit positions and assigns the shifted value to the "Xval" variable. It then assigns the 15-bit product value with bit positions 0 through 14 to be converted to the "Result" variable, sets the "Mask" bit test mask variable to test bit position 14 of the Product variable, and sets the "Index" loop index value to zero before passing control to step 562.

Step 562 exclusive-ors the Mask variable with the Product variable to determine whether the tested bit has a binary 1 bit value. If not, control passes to step 566. Otherwise, control passes to Step 564.

Step 564 exclusive-ors the Result variable with the Xval variable, converting the tested bit to a zero bit in the computed value. It assigns the computed value to the Result variable before passing control to step 566.

Step 566 right shifts the Mask variable and assigns the shifted value to Mask. It then right shifts the Xval variable and assigns the shifted value to Xval. These two operations prepare the loop to convert the next lower-order bit value to a zero value if it has a 1 value. Step 566 increments the Index loop index variable before passing control to step 570.

Step 570 tests whether the loop has performed 7 iterations. If the loop has performed 7 iterations, control passes to step 580. If not, control passes back to step 562 for additional processing.

Eventually step 570 determines that 7 loop iterations have completed and control passes to step 580 and the process ends having successfully converted a 15-bit bit-wise modulo 2 product value to a congruent finite field element in a Galois Field GF(2^8) as an extension field over GF(2).

Figure 2C:
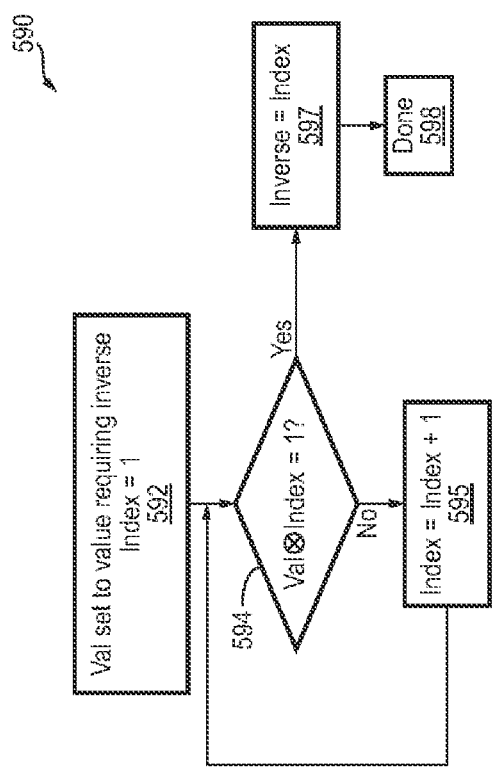
FIG. 2C is a flow diagram of method steps for determining the multiplicative inverse of an element within a Galois Field GF(2^8) as an extension field over GF(2), according to an embodiment of the present invention.

FIG. 2C is an example flow diagram of method steps for determining the inverse of an element within a Galois Field GF(2^8) as an extension field over GF(2). All non-zero elements in such fields always have a multiplicative inverse. This method in FIG. 2C is computationally inefficient compared to other methods such as using logarithm and antilogarithm tables and is provided an example to simplify discussion. Thus, it is not to be considered as limiting the scope of this invention.

Since a recovery operation may use the same inverse values many times, a host processor can determine the inverse values and place them in GPU local parallel processing memory 204 that all threads can access before launching the threads.

The method in FIG. 2C begins by setting the "Index" variable to a value of 1 and assumes that the "Val" variable is preset to the value that uses an inverse value determination. Control passes to step 594 that computes the product of the Val and Index variables. The multiplication operation is performed in a Galois Field GF(2^8) as an extension field over GF(2).

If the computed product in step 594 has a value of 1, control passes to step 597 which sets the "Inverse" variable value to the value of the Index value and control passes to step 598, completing the inverse value determination. Otherwise, the computed product in step 594 does not have a value of 1 and control passes to step 595. Step 595 increments the Index variable and passes control back to step 594 for another trial attempt.

Practitioners skilled in the art will appreciate that the inverse value determination method in FIG. 2C does not provide an error path when no inverse is found. This is because all non-zero elements within a Galois Field GF(2^8) as an extension field over GF(2) must have an 8-bit multiplicative inverse. Failing to identify an inverse for an element is indicative of an incorrect attempt to construct or otherwise operate within a Galois field. Finally, practitioners skilled in the art appreciate that the zero value has no inverse and attempting to identify one can result in undetermined processor behaviors and side effects. Therefore the "Val" variable in step 592 should never have a zero value.

Erasure Code Data Protection and Recovery Computation on a GPU Co-Processor

The following example embodiment is simple for clarity. It describes an example that uses a discreet GPU with independent memory both the GPU and CPU 102 can access. The method only generates Data Units for two related data recovery segments named P 412[N−2] and Q 412[N−1]. In addition, the recovery method assumes two identified File Data Segments require recovery. It also assumes the coefficients used to calculate the Q related data recovery segment Data Units are compiled into the programming logic (the kernel) the GPU uses to generate the P 412[N−2] and Q 412[N−1] related data recovery segments. Moreover, it assumes the GPU provides enough threads that an individual thread only processes one Data Unit per segment. Hence, a stripe contains one Data Unit per segment (S=1 and K=T). Finally, it assumes the grid overlay is one-dimension, the grid block size evenly divides K (the number of Data Units in a segment), and the host CPU 102 launches exactly the number of grid blocks necessary to perform the calculations.

Persons skilled in the art will recognize that, for discussion simplicity, some embodiments do not teach considerations such as coalesced data access by threads. Moreover, among other things, some embodiments do not include additional considerations such as page-locked (pinned) host memory, concurrent kernel execution, asynchronous GPU data transfer operations, dynamic parallelism, and CPU-GPU unified memory architectures. Embodiments that can exploit or otherwise utilize such architectural features, and others, may exhibit significant performance acceleration benefits other embodiments do not exhibit.

Moreover, with CPU-GPU unified memory architecture embodiments, such as with discrete GPUs and GPUs integrated into CPU System-on-Chips (SOCs), all explicit data transfer steps described in some embodiments may not be required.

Thus, the following example of one embodiment is one of many possible ways the invention can be embodied and is intentionally simplified in order to avoid obscuring aspects of the embodiment and should not be considered as limiting the invention's scope.

Figure 3A:
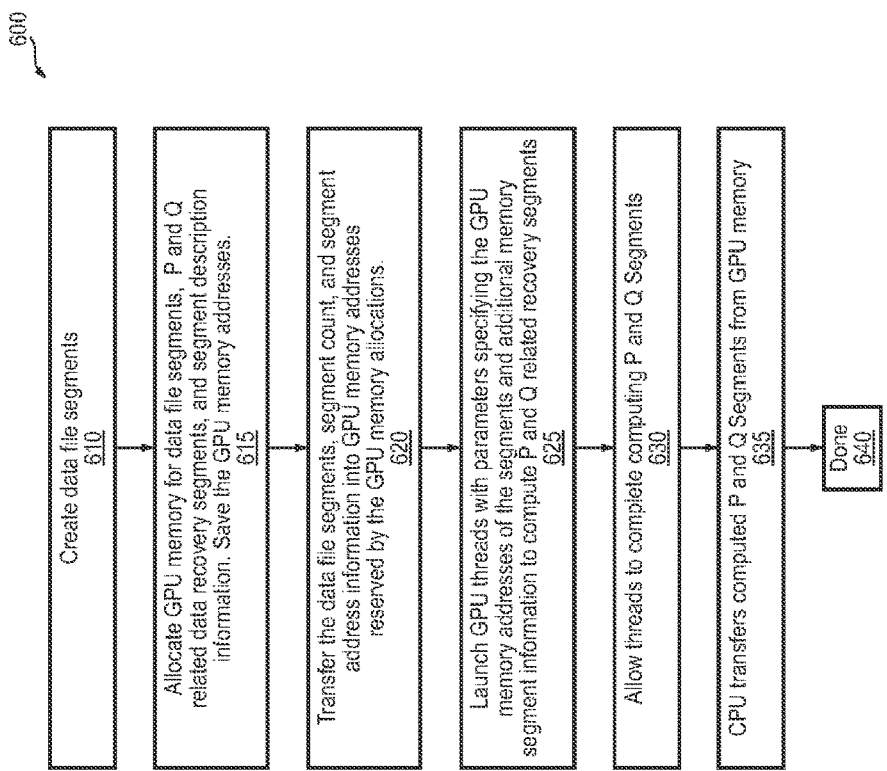
FIG. 3A is a flow diagram of method steps for generating P and Q related data recovery segment Data Units, according to an embodiment of the present invention.

FIG. 3A is an example flow diagram of method steps for generating P 412[N−2] and Q 412[N−1] related data recovery segment Data Units.

Step 610 begins the method by partitioning a File Data data-block into N equal-size File Data Segments 412. This may require appending Data Unit padding to the last data segment to ensure all segments are the same size. Control now passes to step 615.

Step 615 allocates space in GPU local parallel processing memory 204 for each of the N data file segments 412, P 412[N−2] and Q 412[N−1] related data recovery segments, and additional segment description information including segment count and segment size. The GPU reserves the space and returns the addresses of the various reserved spaces. The host CPU 102 preserves the GPU local parallel processing memory 204 addresses for the various allocated spaces. Control now passes to step 620.

Step 620 transfers the N data file segments 412, segment count, and segment address information into GPU local parallel processing memory 204 addresses reserved by step 615 GPU local parallel processing memory 204 allocations. The transfers are to locations the GPU returned in the step 615 allocation step. Control now passes to step 625.

In step 625, host CPU 102 launches the GPU threads with parameters specifying the GPU local parallel processing memory 204 addresses of the segments 412 and additional memory segment information to compute P 412[N−2] and Q 412[N−1] related recovery segments. Control now passes to step 630.

Step 630 ensures all threads have completed processing before passing control to step 635.

In step 635, CPU 102 transfers the computed P 412[N−2] and Q 412[N−1] related data recovery segments from GPU local parallel processing memory 204 to System Memory 104 for access by other software handling the final disposition of the computed P 412[N−2] and Q 412[N−1] related data recovery segments. Control now passes to step 640.

The method terminates in step 640.

Figure 3B:
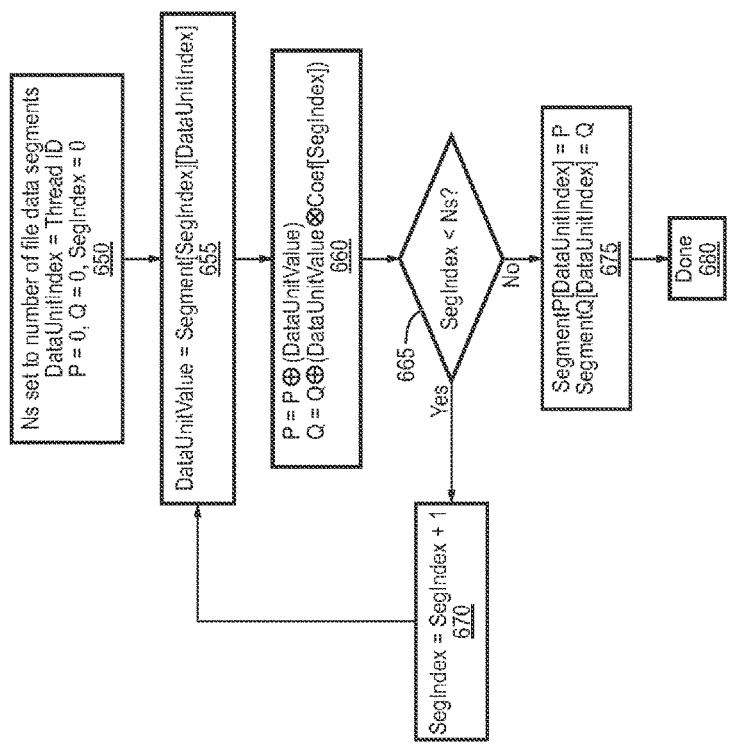
FIG. 3B is a flow diagram of method steps a thread performs to generate a Data Unit for both P and Q, according to an embodiment of the present invention.

FIG. 3B is an example flow diagram of method steps a thread performs to generate a Data Unit for both P 412[N−2] and Q 412[N−1].

In step 650, the method accesses the segment information passed into local parallel processing memory 204 in step 620 and uses this information to set variable "N" to the number of data file segments 412. It also sets the variable "ThreadID" to the processing thread ID). Persons skilled in the art of CUDA programming recognize the thread ID can be determined by computing the value of blockIdx.x*blockDim.x+threadIdx.x where blockIdx.x, blockDim.x, and threadIdx.x are private registers provided to each thread. Other programming environments such as OpenCL have similar thread ID identification provisions. Finally, the variables "P", "Q", and "SegIndex" are set to a zero value. Control now passes to step 655.

Step 640. Uses the ThreadID variable to index into the first segment and extract the segment[SegIndex] 412 Data Unit value into the "DataUnit variable. Control now passes to step 660.

Step 660 updates the P variable by exclusive-oring the DataUnit value with the existing P variable value and assigning the result to the P variable. Step 660 also updates the Q variable by exclusive-oring the current Q variable value with the product of the DataUnit value multiplied by the coefficient associated with segment[SegIndex] 412. The multiplication operation is performed in a Galois Field $GF(2^8)$ as an extension field over $GF(2)$. The result is assigned to the Q variable. This embodiment assumes the coefficient value is known to the programming logic as a compiled value. Control now passes to step 665.

Step 665 tests whether P and Q variable calculations have included calculations involving all data file segments 412. If not, control passes to step 670 which increments the segment index before passing control back to step 655 for another loop iteration to include Data Unit calculations for another segment 412. Otherwise, the P and Q variable calculations have included calculations involving all data file segments 412 and control passes to step 675.

Step 675 assigns the P variable value to the corresponding P segment 412 data unit and assigns the Q variable value to the corresponding Q segment 412 data unit. Control now passes to step 675 which terminates the thread's processing. Other threads will process an individual stripe of one Data Unit per segment 412 and the collective threads process all Data Units in all segments 412.

Figure 4A:
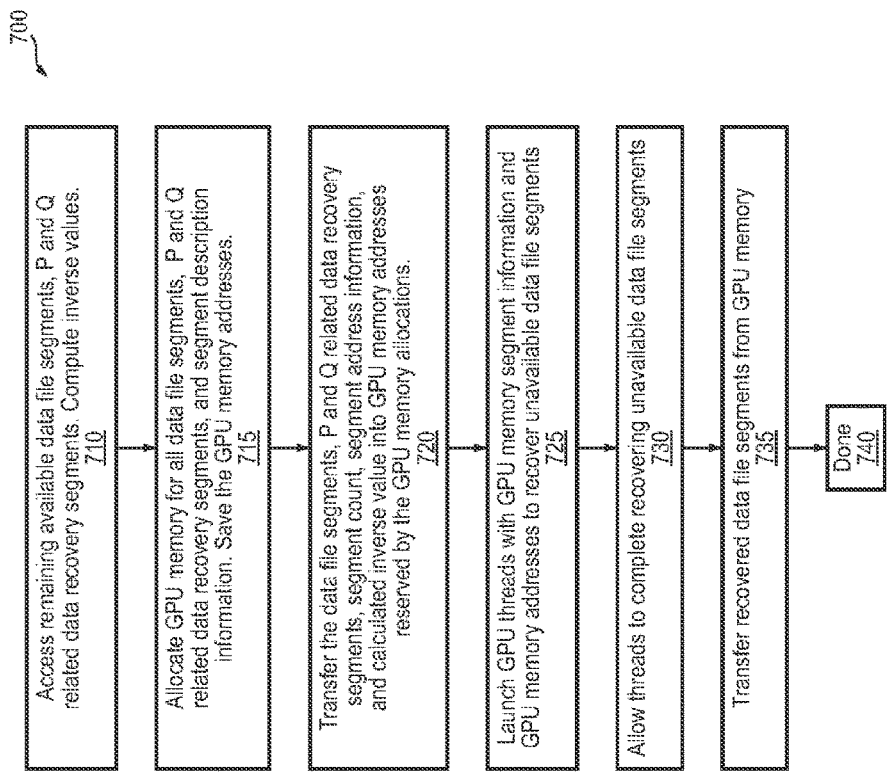
FIG. 4A is a flow diagram of method steps for recovering two File Data Segments using the P and Q related data recovery segment Data Units and the remaining available File Data Segments, according to an embodiment of the present invention.

FIG. 4A is a flow diagram of method steps for recovering two File Data Segments 412 using the P 412[N−2] and Q 412[N−1] related data recovery segment Data Units and the remaining available File Data Segments 412. The unavailable File Data Segments 412 and their associated Q calculation Data Unit coefficients are known to the CPU 102 programming. Let the unavailable segments 412 be designated as segment[X] 412 and segment[Y] 412. Let their associated coefficients be designated Ax and Ay. Let the "Ns" variable have a value equal to the number of File Data Segments 412.

Step 710 begins the method by accessing the remaining Ns−2 available data file segments as well as their P and Q related data recovery segments. From Equation 11, it may be advantageous to calculate the inverse of $(A_x \oplus A_y)$, designated $(A_x \oplus A_y)^{-1}$, since it is used by all threads in their recovery operations as a coefficient.

Step 715 allocates space in GPU local parallel processing memory 204 for each of the N data file segments 412, including the two missing segments 412, the P 412[N−2] and Q 412[N−1] related data recovery segments, and additional segment description information including segment count, segment size, and the calculated value of $(A_x \oplus A_y)^{-1}$. The GPU reserves the local parallel processing memory 204 space and returns the addresses of the various reserved spaces. The host CPU 102 preserves the GPU local parallel processing memory 204 addresses for the various allocated spaces. Control now passes to step 720.

Step 720 transfers the Ns-2 available data file segments 412, the P 412[N−2] and Q 412[N−1] related data recovery segments, File Data segment count, segment address information including missing segment[X] 412 and segment[Y] 412 segment addresses, and calculated inverse value of $(A_x \oplus A_y)^{-1}$ into GPU local parallel processing memory 204 addresses reserved by step 715 GPU local parallel processing memory 204 allocations. The transfers are to locations the GPU returned in the step 715 allocation step.

The missing segment[X] 412 and segment[Y] 412 cannot be transferred and their respective reserved spaces are where the recovery method places the recovered segment[X] 412 and segment[Y] 412 information. Control now passes to step 725.

In step 725, host CPU 102 launches the GPU threads with parameters specifying the GPU local parallel processing memory 204 addresses of the N−2 File Data Segments 412, the P and Q segments 412, missing segment[X] 412 and segment[Y] 412 segment identification, additional memory segment information, and inverse value calculation to recover the missing segment[X] 412 and segment[Y] 412 segments. Control now passes to step 730.

Step 730 ensures all threads have completed processing before passing control to step 735.

In step 735, CPU 102 transfers the recovered missing segment[X] 412 and segment[Y] 412 segment from GPU local parallel processing memory 204 to System Memory 104 for access by other software handling the final disposition Control now passes to step 740.

The method terminates in step 740.

Figure 4B:
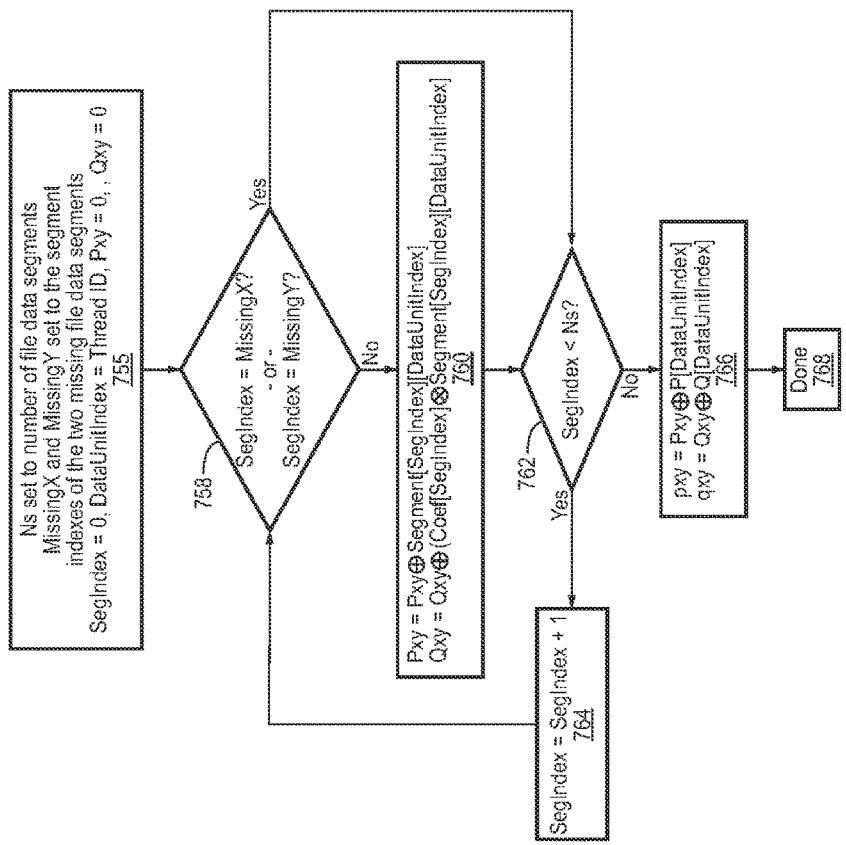
FIG. 4B is a flow diagram of part of the method steps a thread performs to recover two File Data Segments, according to an embodiment of the present invention.

FIG. 4B is an example flow diagram of part of the method steps a thread performs to recover two File Data Segments 412.

In step 755, the thread accesses information host CPU 102 placed in GPU local parallel processing memory 204 that quantifies the value of the variable "N" which is the total number of data file segments 412. The thread also accesses their allocated space locations in GPU local parallel processing memory 204 as well as the location of the P 412[N−2] and Q 412[N−1] related data recovery segments 412 in GPU local parallel processing memory 204. The indexes of the missing File Data Segments are passed by host CPU 102 and assigned to the two variables "MissingX" and MissingY". The segment indexing variable "SegIndex" is set to a zero value and the "DataUnitIndex" indexing variable value is set to the thread ID value. The "Pxy" and "Qxy" variables are both set to a zero value and correspond to the respective $P_{xy}$ and $Q_{xy}$ variables in Equation 3 and Equation 5. Control now passes to step 758.

Step 758 tests if the current segment index is for a missing File Data segment 412. If it is, control passes to step 762. Otherwise, control passes to step 760.

Step 760 indexes within the P 412[N−2] related recovery data segment 412 to access the correct segment Data Unit and exclusive-or its value to the current value of the Pxy variable. It assigns the result of this exclusive-or operation to the Pxy variable. Step 760 next indexes within the Q 412[N−1] related recovery data segment 412 to access the correct segment Data Unit and multiply its value with the coefficient associated with the Q 412[N−1] related recovery data segment 412. This multiplication operation is performed in a Galois Field GF(2^8) as an extension field over GF(2). Step 760 next exclusive-ors the value of this operation to the current value of the Qxy variable and assigns the result of the exclusive-or operation to the Qxy variable. Control now passes to step 762.

Step 762. Tests if the Data Units from all available File Data Segments 412 have been included in the Pxy and Qxy variable calculations. If not, control passes to step 764 which increments the SegIndex index value to initiate another loop iteration and passes control to step 758. Otherwise, control passes to step 766.

Step 766 exclusive-ors the calculated Pxy variable value with the indexed P 412[N−2] related recovery data segment 412 Data Unit. The result of this exclusive-or is assigned to the pxy variable (lower-case "p"). Step 766 next exclusive-ors the calculated Qxy variable value with the indexed Q 412[N−1] related recovery data segment 412 Data Unit. The result of this exclusive-or is assigned to the qxy variable (lower-case "q"). The pxy variables and qxy variables respectively correspond to the pxy and qxy variables in Equations 7 and 8. Control now passes to step 766 which completes this portion of the recovery method.

Figure 4C:
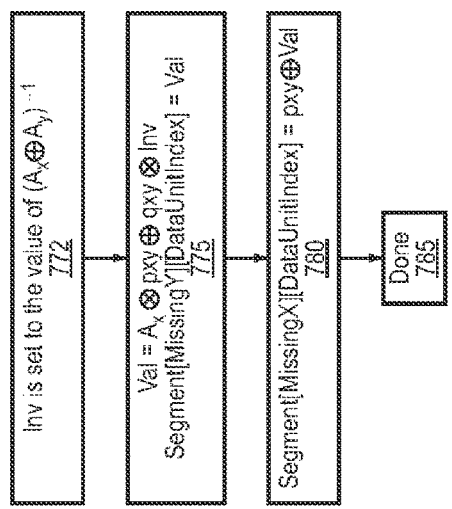
FIG. 4C completes the flow diagram of the method steps a thread performs to recover two File Data Segments, according to an embodiment of the present invention.

FIG. 4C is an example flow diagram that illustrates completing the method of a thread performing recovery of two File Data Segments 412.

Step 772 recognizes that host CPU 102 placed the computed value of $(A_x \oplus A_y)^{-1}$ in GPU local parallel processing memory 204. It computed this value by first calculating the value of $(A_x \oplus A_y \oplus A_y)$ and then iteratively multiplying using the iterative multiplication methods illustrated in FIG. 2A, FIG. 2B, and FIG. 2C. The variable "Inv" is set to the value of $(A_x \oplus A_y \oplus A_y)^{-1}$. Control now passes to step 775.

Step 775 computes the value of $[(A_x \oplus \oplus \oplus \text{pxy} \oplus \text{qxy}) \oplus \oplus \oplus \oplus \text{Inv}]$ and assigns the result to the "Val" variable. Following Equation 11, Val has the value of the corresponding Data Unit in segment[MissingY] 412 at offset DataUnitIndex. So, step 775 assigns File Data segment[MissingY] [DataUnitIndex] 412 the value of the Val variable. Control now passes to step 780.

Following Equation 12, step 780 exclusive-ors the pxy variable with the Val variable to generate the value of Segment[MissingX][DataUnitIndex]. The thread recovery of two Data Units at a specific offset within the MissingX File Data segment 412 and the MissingY File Data segment 412 is complete. The other launched threads will recover their corresponding Data Units within the MissingX and MissingY File Data segment. When all thread processing completes, the MissingX and MissingY File Data segment recovery is complete.

In sum, techniques for performing efficient erasure code data protection and recovery computations on a multi-threaded processor are disclosed. Persons skilled in the art will understand that any system configured to perform the method steps, in any order, is within the scope of the invention.

Using embodiments of the invention, erasure code data protection and recovery computation complexity is reduced from complex Galois Field arithmetic to simple bit-wise XOR summations and bit manipulations. A set of threads within a multi-threaded processor are configured to perform erasure code data protection and recovery computations on a Stripe of data within an erasure code data protection and recovery Stripe. In one embodiment, each thread performs erasure code data protection and recovery computations on one Data Unit per segment.

One advantage of embodiments of the present invention is that otherwise complex erasure code data protection and recovery computations are simplified to efficient arithmetic instructions or basic one-dimension table lookup operations, thereby reducing computational complexity and improving overall system efficiency. When implemented on an appropriate multi-threaded processor platform, significant system performance improvements may be achieved.

Persons skilled in the art will readily recognize that the techniques taught herein for performing erasure code data protection and recovery computations may be implemented as customized fixed-function hardware or as a software program executing on an appropriately configured hardware system. Moreover, the taught techniques use Reed Solomon techniques and other methods are possible, including those using other data transforms such as the Mojette transform which uses different mathematical techniques which a Graphics Processor can perform.

One embodiment of the invention may be implemented as a program product for use with a computer system. The program(s) of the program product define functions of the embodiments (including the methods described herein) and can be contained on a variety of computer-readable memory and storage media. Illustrative computer-readable storage media include, but are not limited to: (i) non-writable storage media (e.g., read-only memory devices within a computer such as CD-ROM segments readable by a CD-ROM drive, flash memory, ROM chips or any type of solid-state non-volatile semiconductor memory) on which information is permanently stored; and (ii) writable storage media (e.g., floppy segments within a diskette drive or hard-storage device or any type of solid-state random-access semiconductor memory) on which alterable information is stored.

Reiterating and supplementing the foregoing, in some embodiments a first processing circuit (e.g., a CPU) may cooperate with a second processing circuit (e.g., a GPU) to perform parity generation (i.e., generation of erasure codes, such as P Erasure Code data segments and Q Erasure Code data segments to protect the File Data Segments) and/or systematic data recovery (i.e., recovery of data after a failure). For example, in a 10 of 12 system with 8-bit Data Units, each set of 10 File Data Units may be protected, in an erasure code operation referred to as parity generation, by 2 Erasure Code Data Units, including a P Erasure Code Data Unit and a Q Erasure Code Data Unit.

To perform parity generation, the CPU may send to the GPU a block of Data Units including a plurality of stripes, each stripe including S Data Units from each of a plurality of segments. The sending may entail, for example, writing the block of Data Units to shared memory to which both the CPU and GPU have access. The CPU may also provide a kernel for the GPU to execute, and a set of one or more constants (that may be hard coded in the kernel, for example, or provided separately to the GPU, e.g., in a separate area of shared memory).

For example, in a 10 of 12 system with S=1 and 8-bit Data Units, a P Erasure Code Data Unit (or "parity value") may be formed as an exclusive-or of each stripe of 10 bytes of data to be protected, and a Q Erasure Code Data Unit may be formed as a weighted exclusive-or of the 10 bytes of data to be protected (i.e., the exclusive-or of a set of products, each such product being a product, in $GF(2^8)$, of a respective weight (of 10 weights) with a respective byte of the stripe). In the text that follows, all operations (e.g., multiplications, additions, powers, and logarithms) may be understood to be in a Galois field (e.g., $GF(2^8)$ for 8-bit Data Units). In some embodiments each Data Unit is an n-bit number, where n is a positive-integer power of 2 (i.e., n equals 2 raised to the power of a positive integer), and the Galois field is $GF(2^n)$.

In such a situation, forming the Q Erasure Code Data Units during parity generation for a large amount of data may involve a large number of multiplication operations in $GF(2^8)$, to form the products of weights and bytes to be protected. Each product calculated may have a factor in common with a large number of other products. For example, the products of the first weight with the first bytes in all of the stripes have the first weight as a common factor. These products may be calculated in a highly parallel manner by the GPU (at the request of the CPU) and the CPU may improve the efficiency of these calculations in the GPU in several ways, by providing a suitable kernel to the GPU and/or by providing a set of one or more constants to the GPU, to aid in performing the multiplications.

Figure 5:
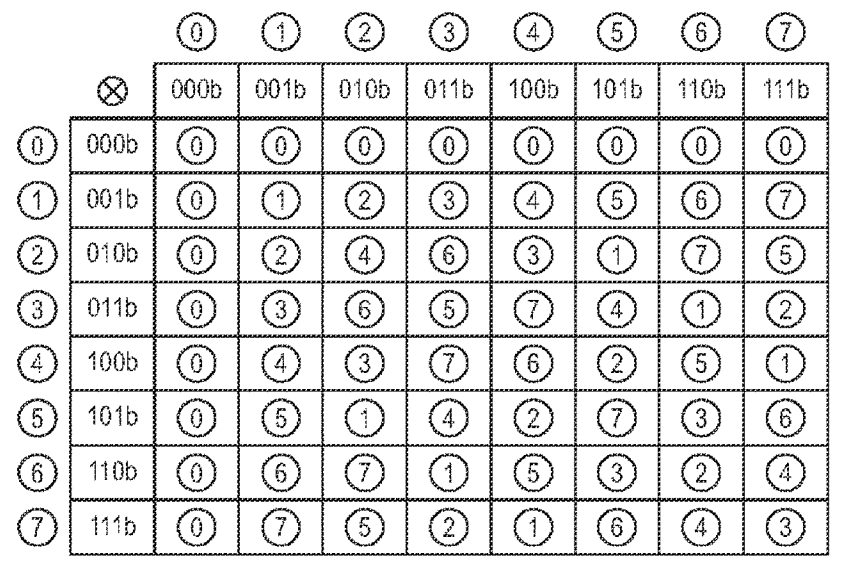

Referring to FIG. 5, for example, a multiplication table may be used. The table may be a two-dimensional array indexed in one dimension by the first factor of a product to be formed and in the second dimension by the second factor of the product to be formed. For ease of illustration, a table for the multiplication of two 3-bit numbers is shown in FIG. 5; a multiplication table for the multiplication of two arbitrary 8-bit numbers may have 256 rows and 256 columns. The size of the table may be reduced slightly (at the cost of additional conditional instructions) by eliminating (i) the rows and columns corresponding to factors of 0 and 1 (for which multiplication is trivial) and (ii) rows and columns corresponding to powers of 2 (for which multiplication may be replaced by a shift operation). In the example above of calculating Q Erasure Code Data Units in a 10 of 12 system, all of the rows except the rows corresponding to the 10 weights may be omitted (or, equivalently, ten 1-dimensional multiplication tables may be used, one for each of the 10 weights). The CPU may send to the GPU a kernel in which, for example, multiplying by the first weight is hard-coded as a lookup operation in a first multiplication table of 10 multiplication tables, multiplying by the second weight is hard-coded as a lookup operation in a second multiplication table of the 10 multiplication tables, and so on.

Figure 6A:
FIG. 6A is a powers table, according to an embodiment of the present invention.
Figure 6B:
FIG. 6B is a logarithm table, according to an embodiment of the present invention.

In another embodiment, each multiplication is performed by taking respective logarithms of the two factors, adding the logarithms, and taking a power (or anti-logarithm) of the sum. The logarithm operation may be coded in the kernel (by the CPU) as a lookup in a logarithm table, which may be a 1-dimensional array (e.g., a 1×256 array for looking up the logarithm of an 8-bit Data Unit). Such an array is illustrated in FIG. 6B. The array in FIG. 6B is illustrated as a 2-dimensional table for ease of illustration in a drawing having an aspect ratio near 1:1; the quantity illustrated is fundamentally a 1-dimensional array, however, that lists the logarithm of each of 256 8-bit numbers. Similarly, a powers (or anti-logarithm) table is a 1-dimensional array, e.g., one that lists the power of each of 256 8-bit numbers. A powers (or anti-logarithm) table is illustrated (in a 2-dimensional format) in FIG. 6A. If multiplication by the weights is to be performed by taking respective logarithms of the two factors being multiplied, adding the logarithms, and taking a power (or anti-logarithm) of the sum, then the CPU may precalculate the logarithms of the 10 weights, and supply them as constants, along with a logarithm table and a powers table, to the GPU. The kernel (also supplied by the CPU) may then instruct the GPU to take the logarithm of each byte to be protected, add the logarithm to the logarithm of a respective weight, and take the power of the sum.

In another embodiment, multiplication is performed as illustrated in FIG. 7, with a first act including the formation of a sum of partial products 705. Each partial product 705 is equal either to the first multiplicand (or "factor") or to zero, depending on the value of a corresponding bit of the second multiplicand. In the case of multiplication in GF($2^8$), the least-significant 8 bits may then be combined using one or more exclusive-or operations with one or more numbers selected from the table 710 on the right side of FIG. 7, each selected number being at a position in the table corresponding to the bit position of a 1 bit in the set of remaining bits (i.e., those bits that are more significant than the least-significant 8 bits) of the sum of the partial products. For example, in FIG. 7, the remaining bits include three ones, at bit positions 9, 10, and 11, respectively, and the product is found by taking the exclusive-or of (i) the least significant 8 bits of the sum of the partial products with (ii) the three numbers at positions 9, 10, and 11 in the right hand side of the table 710 on the right side of FIG. 7. The sum of the partial products may be hard-coded as a combination of (i) seven left-shift operations and (ii) a plurality of intervening addition operations, one addition being done for each bit position of the second multiplicand which is a 1. If the sum of the partial products, with the second factor being a constant, is coded in this manner, in the kernel, by the CPU, then the need for the GPU to execute a conditional instruction for each bit of the second multiplicand (performing an addition if the corresponding bit of the second multiplicand is a 1) is avoided, significantly reducing the number of operations used.

Similar improvements in efficiency may be possible when the erasure code operation performed by the GPU is a systematic data recovery operation. A systematic data recovery operation in a 10 of 12 system may involve setting up two linear equations for two unknowns, the two unknowns being, for example, two Data Units lost from a stripe originally including 10 File Data Units and two Erasure Code Data Units (a P Erasure Code Data Unit and a Q Erasure Code Data Unit). The first of these equations may be derived from the equation for the P Erasure Code Data Unit; in this equation, the coefficient of each unknown is 1 and the right hand side of the equation is a first intermediate data recovery value equal to the exclusive-or of the P Erasure Code Data Unit with the remaining Data Units (i.e., the 8 data units that were not lost from the stripe). The second of these equations may be derived from the equation for the Q Erasure Code Data Unit; in this equation, the coefficient of each unknown is the respective weight corresponding to that Data Unit, and the right hand side of the equation is a second intermediate data recovery value equal to the exclusive-or of (i) the Q Erasure Code Data Unit and (ii) the weighted exclusive-or of the remaining Data Units. The two linear equations may be written as a matrix equation, and the solution may be written as the product of (i) a 2×2 inverse matrix and (ii) a two-element vector including (e.g., consisting of) the first intermediate data recovery value and the second intermediate data recovery value. When performing a systematic data recovery operation, the CPU may precalculate the 2×2 inverse matrix and send it to the GPU, along with the remaining Data Units, the P Erasure Code Data Unit and the Q Erasure Code Data Unit. In a system in which a larger number of lost values may be recovered, and N×N matrix may be used (N being a positive integer) instead of a 2×2 matrix.

The CPU may also send to the GPU data and/or code that streamlines the multiplication operations involved in the systematic data recovery operation, such as (as described above, in the context of a parity generation operation), one or more multiplication tables, or a powers table and a logarithm table. In some embodiments, to streamline the finding, in the GPU, of the solution of the independent linear equations (e.g., the solution of two independent linear equations in two unknowns, in a 10 of 12 system), the CPU may send to the GPU four code segments, each corresponding to one of the elements of the 2×2 inverse matrix and consisting of a sequence of shift operations and (modulo 2) addition operations that implements multiplication by the respective matrix element.

The GPU may include a large number of cores, e.g., hundreds or thousands of cores, each having an identification number. At startup, each core may determine or "discover" its identification number. In operation, each core may execute a thread (having a thread ID that is the same as the identification number of the core) to perform erasure code operations on a respective subset of the block of Data Units provided by the CPU to the GPU. For example, a first core (having identification number 0 and executing a thread with thread ID 0) may process a first sub-block of the Data Units, a second core may process a second sub-block of the Data Units, and so forth. In another embodiment, if the GPU includes M cores, the first core may process every $M^{th}$ Data Unit starting with a Data Unit at address 0, the second core may process every $M^{th}$ Data Unit starting with a Data Unit at address 1, and so forth. Each CPU core may have an instruction set including instructions with addressing modes which, when executed, use an address calculated using the core identification number.

In view of the foregoing, some embodiments of the present invention provide methods to streamline erasure code operations such as parity generation operations and systematic data recovery operations. A first processing circuit, such as a CPU, may send to a second processing circuit, such as a GPU, data for which Erasure Code Data Units are to be generated, or data including Erasure Code Data Units, from which lost data are to be recovered. The first processing circuit may also send, to the second processing circuit, a kernel including instructions for performing one or more erasure code operations, and a set of one or more constants, that the second processing unit may use to streamline erasure code operations.

The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed wiring board (PWB) or distributed over several interconnected PWBs. A processing circuit may contain other processing circuits; for example a processing circuit may include two processing circuits, an FPGA and a CPU, interconnected on a PWB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although example embodiments of an erasure code data protection and recovery computation system and method have been specifically described and illustrated herein, many modifications and variations will be apparent to those skilled in the art. Accordingly, it is to be understood that an erasure code data protection and recovery computation system and method constructed according to principles of this invention may be embodied other than as specifically described herein. The invention is also defined in the following claims, and equivalents thereof.

What is claimed is:

1. A system for storing data, the system comprising:
a first processing circuit;
the first processing circuit being configured to send to a second processing circuit:
 a plurality of input Data Units;
 a request specifying an erasure code operation to be performed, the erasure code operation being:
  a parity generation operation; or
  a systematic data recovery operation; and
 one or more constants to be used in performing the erasure code operation
wherein the second processing circuit comprises a plurality of cores, a first core of the plurality of cores being configured to:
discover, at startup, an identification number of the first core and of a thread to be executed by the first core, and
perform an erasure code operation using an input Data Unit stored at a memory address calculated using the identification number.

2. The system of claim 1, wherein the one or more constants comprise:
a powers table, listing, for each of a plurality of input values, a power of the input value in a Galois field; and
a logarithm table, listing, for each of the plurality of input values, a logarithm of the input value in the Galois field.

3. The system of claim 2, wherein each of the input Data Units is an n-bit number, n being a positive-integer power of 2, and the Galois field is GF($2n$).

4. The system of claim 1, wherein the one or more constants comprise an inverse array suitable for performing a systematic data recovery operation.

5. The system of claim 4, wherein the inverse array is a N×N array that when multiplied, in a Galois field, by a N×1 vector produces N recovered Data Units, N being a positive integer.

6. The system of claim 1, wherein the one or more constants comprise a multiplication table.

7. The system of claim 6, wherein the multiplication table lists, for each possible value of a first factor, a product of the first factor and a weight, the weight being one of a plurality of weights used to calculate a Q Erasure Code Data Unit as a weighted exclusive-or of Data Units in a slice.

8. A system for storing data, the system comprising:
a first processing circuit;
the first processing circuit being configured to send to a second processing circuit:
 a plurality of input Data Units;
 a request specifying an erasure code operation to be performed, the erasure code operation being:

a parity generation operation; or
a systematic data recovery operation; and
a kernel, the kernel comprising machine code instructions that when executed by the second processing circuit cause the second processing circuit to perform the erasure code operation,
wherein the kernel includes instructions for performing a multiplication of a first factor and a second factor, without conditional operations,
wherein the second processing circuit comprises a plurality of cores, a first core of the plurality of cores being configured to:
discover, at startup, an identification number of the first core and of a thread to be executed by the first core, and
perform an erasure code operation using an input Data Unit stored at a memory address calculated using the identification number.

9. The system of claim 8, wherein the instructions for performing the multiplication of the first factor and the second factor comprise a plurality of left-shift operations and a plurality of addition operations, each addition operation of the plurality of addition operations being a modulo 2 addition operation and corresponding to a corresponding bit of the second factor having a value of 1.

10. A system for storing data, the system comprising:
a first processing circuit; and
a second processing circuit,
the first processing circuit being configured to send to the second processing circuit:
a plurality of input Data Units;
a request specifying an erasure code operation to be performed, the erasure code operation being:
a parity generation operation; or
a systematic data recovery operation; and
one or more constants to be used in performing the erasure code operation,
wherein the second processing circuit comprises a plurality of cores, a first core of the plurality of cores being configured to:
discover, at startup, an identification number of the first core and of a thread to be executed by the first core, and
perform an erasure code operation using an input Data Unit stored at a memory address calculated using the identification number.

11. The system of claim 10, wherein the first processing circuit is a central processing unit and the second processing circuit is a graphics processing unit.

12. The system of claim 10, wherein the one or more constants comprise:

a powers table, listing, for each of a plurality of input values, a power of the input value in a Galois field; and
a logarithm table, listing, for each of the plurality of input values, a logarithm of the input value in the Galois field.

13. The system of claim 12, wherein each of the input Data Units is an n-bit number, n being a positive-integer power of 2, and the Galois field is GF($2^n$).

14. The system of claim 10, wherein the one or more constants comprise an inverse array suitable for performing a systematic data recovery operation.

15. The system of claim 14, wherein the inverse array is a N×N array that when multiplied, in a Galois field, by a N×1 vector produces N recovered Data Units, N being a positive integer.

16. The system of claim 10, wherein the one or more constants comprise a multiplication table.

17. The system of claim 16, wherein the multiplication table lists, for each possible value of a first factor, a product of the first factor and a weight, the weight being one of a plurality of weights used to calculate a Q Erasure Code Data Unit as a weighted exclusive-or of Data Units in a slice.

18. A method for storing or restoring data, the method comprising:
sending, by a first processing circuit to a second processing circuit:
a plurality of input Data Units;
a request specifying an erasure code operation to be performed, the erasure code operation being:
a parity generation operation; or
a systematic data recovery operation; and
one or more constants to be used in performing the erasure code operation; and
performing, by the second processing circuit, the requested erasure code operation,
wherein the second processing circuit comprises a plurality of cores, a first core of the plurality of cores being configured to:
discover, at startup, an identification number of the first core and of a thread to be executed by the first core, and
perform an erasure code operation using an input Data Unit stored at a memory address calculated using the identification number.

19. The method of claim 18, wherein the first processing circuit is a central processing unit and the second processing circuit is a graphics processing unit.

* * * * *

UNITED STATES PATENT AND TRADEMARK OFFICE
CERTIFICATE OF CORRECTION

PATENT NO.       : 10,230,398 B2
APPLICATION NO.  : 15/431629
DATED            : March 12, 2019
INVENTOR(S)      : William David Schwaderer Page 1 of 1

It is certified that error appears in the above-identified patent and that said Letters Patent is hereby corrected as shown below:

In the Claims
Column 30, Line 46, Claim 3     delete "(2n)." and
                                insert -- $(2^n)$. --.

Signed and Sealed this
Eighteenth Day of February, 2020

Andrei Iancu
*Director of the United States Patent and Trademark Office*